(12) United States Patent
Ohsaki

(10) Patent No.: US 6,620,556 B2
(45) Date of Patent: *Sep. 16, 2003

(54) MASK FOR MULTIPLE EXPOSURE

(75) Inventor: Yumiko Ohsaki, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/524,257

(22) Filed: Mar. 14, 2000

(65) Prior Publication Data

US 2003/0059685 A1 Mar. 27, 2003

(30) Foreign Application Priority Data

Mar. 15, 1999 (JP) .......................................... 11-068547

(51) Int. Cl.⁷ .............................. G03F 9/00; G03C 5/00
(52) U.S. Cl. ............................ 430/5; 430/394; 430/396
(58) Field of Search .......................... 430/5, 394, 396; 378/34, 35

(56) References Cited

U.S. PATENT DOCUMENTS

| 5,415,835 A | 5/1995 | Brueck et al. ............... 430/311 |
| 5,563,009 A | * 10/1996 | Bae ................................. 430/5 |
| 5,585,210 A | * 12/1996 | Lee et al. ....................... 430/5 |

FOREIGN PATENT DOCUMENTS

| JP | 10-201333 A | 8/1998 |
| JP | 10-221095 A | 8/1998 |
| JP | 10-221097 A | 8/1998 |

* cited by examiner

Primary Examiner—Mark F. Huff
Assistant Examiner—Saleha R. Mohamedulla
(74) Attorney, Agent, or Firm—Fitzpatrick, Cella, Harper & Scinto

(57) ABSTRACT

A mask for multiple exposure includes a plurality of periodic patterns in which a relation $0.5S<D<1.5S$ is satisfied, where S is the spacing between lines of a first periodic pattern of the plurality of periodic patterns and D is the spacing between the first periodic pattern and a second periodic pattern, of the plurality of periodic patterns, juxtaposed to the first periodic pattern with respect to the periodicity direction. The first periodic pattern and the second periodic pattern are free from overlapping or intersecting with each other.

16 Claims, 17 Drawing Sheets

PATTERN SPACING
=0.5S OR LESS

PATTERN SPACING
=0.5S

PATTERN SPACING
=2.5S

CASE1: NEGATIVE TYPE RESIST

CASE2: POSITIVE TYPE RESIST (P1=P2:L=0.12 μmL/S)

PATTERN SPACING 20S
2.4 μm

PATTERN SPACING 2S
0.24 μm

L=0.12 μm
NA 0.6
σ 0.2

(A) PERIODIC PATTERN (B) STANDARD EXPOSURE PATTERN (C) COMBINED PATTERN

MASK FOR MULTIPLE EXPOSURE

FIELD OF THE INVENTION AND RELATED ART

This invention relates generally to a mask and an exposure method using the same. More particularly, the invention is concerned with a mask and an exposure method which can be suitably used in the manufacture of various devices such as semiconductor chips (e.g., ICs or LSIs), display devices (e.g., liquid crystal panels), detector elements (e.g., magnetic heads), and image pickup devices (e.g., CCDs), for example.

The manufacture of microdevices such as ICs, LSIs or liquid crystal panels, for example, use a projection exposure method and a projection exposure apparatus wherein a circuit pattern formed on a photomask or reticle (hereinafter, "mask") is projected through a projection optical system onto a photosensitive substrate such as a silicon wafer or a glass plate (hereinafter, "wafer") which is coated with a photoresist, for example, by which the circuit pattern is transferred (photoprinted) to the wafer.

In such a projection exposure method and projection exposure apparatus which play a main role in wafer microprocessing procedures, many attempts have been made to improve the resolution and to enlarge the exposure area in order that an image (circuit pattern image) of a size (linewidth) of 0.5 micron or less can be formed in a wider range.

On the other hand, currently, projection exposure apparatuses having an excimer laser as a light source are used widely, because of its high projection resolving power. However, it is still difficult to produce a pattern image of 0.15 micron or less.

U.S. Pat. No. 5,415,835 shows a technique for forming a very fine pattern in accordance with dual-beam interference exposure. With this dual-beam interference exposure, a pattern of a linewidth 0.15 micron or less can be produced on a wafer.

The same assignee of the subject application has proposed in Japanese Patent Application Nos. H10-221095, H10-201333 and H10-221097 an exposure method by which, through a dual exposure process to a photosensitive substrate (to be exposed) including a periodic pattern exposure and an ordinary (standard) exposure, a circuit pattern having a portion of 0.15 micron or less can be produced.

Here, the term "ordinary exposure" or "standard exposure" refers to an exposure process by which an arbitrary pattern can be photoprinted although the resolution is lower than that of the periodic pattern exposure. A representative example of it is the exposure process to be performed by projection of a mask pattern with a projection optical system.

A pattern to be printed by the standard exposure (hereinafter, "standard exposure pattern") may include a very fine pattern less than the resolution. The periodic pattern exposure is a process for forming a periodic pattern of a similar linewidth as that of the very fine pattern. Such a periodic pattern exposure may use a Levenson type phase shift mask, for example.

FIG. 23 is a schematic view for explaining a dual exposure process. A periodic pattern (A) and a standard exposure pattern (B) are printed, by dual exposure, on the same position, by which a combined synthetic pattern (image) (C) is produced. Details of the principle of multiple exposure will be described later.

FIG. 24 is a schematic view for explaining an inconvenience to be caused when a very fine pattern is formed through a dual exposure process using a periodic pattern and a standard exposure pattern. FIG. 24, at (A), shows the relation between first and second periodic patterns 1 and 2. FIG. 24, at (B), shows the relation between first and second standard patterns 1 and 2. FIG. 24, at (C), shows superposition of patterns by dual exposure. FIG. 24, at (D), shows the relation between first and second design patterns 1 and 2. FIG. 24 is an example wherein a pattern is to be formed in accordance with light transmitting portions, and the dual exposure process is performed so as to produce two design patterns (D) finally.

The standard exposure pattern shown at (B) in FIG. 24 may be analogous to the design pattern (D). Although it should be determined in light of the magnification of the exposure apparatus, in FIG. 24 it is illustrated with a simple magnification of 1.

The periodic pattern shown at (A) in FIG. 24 may be prepared in accordance with a very-fine line portion of the standard exposure pattern (B), and it may be made with the same pitch as a pattern being extracted only from the very-fine line portion of the standard exposure pattern. Thus, the periodic pattern (A), the standard exposure pattern (B) and the design pattern (C) in each set may have the same pitch.

The periodicity number of the periodic pattern (A) may be the same as or larger than that of the pattern being extracted from the very-fine line portion described above.

The shapes of the first and second periodic patterns 1 and 2 may be determined in accordance with the first and second design patterns 1 and 2. However, it has been found that, in dependence upon the spacing D between the first and second periodic patterns 1 and 2 which is determined in accordance with disposition of the design patterns 1 and 2, during the periodic pattern exposure process there may occur a disturbance in periodicity (i.e., disturbance of pattern) at the boundary between the first and second periodic patterns 1 and 2.

More specifically, it has been found that, if the pitch $P_1$ of the first periodic pattern 1 and the pitch $P_2$ of the second periodic pattern 2 differ from each other, there may occur a disturbance of periodicity at the boundary between the periodic patterns 1 and 2.

Also, even in a case wherein the pitches $P_1$ and $P_2$ of the design patterns 1 and 2 are equal to each other ($P_1=P_2$), in dependence upon a disposition of the design patterns, there may occur a disturbance in the periodic pattern. Now, an example of L=S where L is the width of lines and S is the width of spacings, both constituting the pitch of the periodic pattern, will be explained. If design patterns 1 and 2, wherein the design pattern spacing D is equal to a multiple of L or S by an odd number, are to be produced, the spacing D between the periodic patterns 1 and 2 is equal to the spacing width S and, therefore, no disturbance will be produced between the periodic patterns 1 and 2.

If, however, the spacing DS is made equal to a multiple of L or S by an even number, the spacing D between the periodic patterns 1 and 2 becomes D=2S. As a result of it, there occurs a disturbance in periodic pitch at the boundary between the two patterns. Further, also in a case where the spacing DS of the design patterns 1 and 2 is not equal to a multiple of S by an integer, the spacing between the periodic patterns 1 and 2 do not satisfy a relation D=S (which does not cause a disturbance in periodicity). As a result, there may occur a disturbance in periodicity.

As described above, since the periodic pattern should be determined in accordance with the design pattern and in light of current situations that patterns should be formed closely to each other, it is difficult to avoid a disturbance in periodicity, with the prior art, at the boundary between two adjacent periodic patterns in a periodic pattern exposure process, included in a multiple exposure procedure.

SUMMARY OF THE INVENTION

It is accordingly an object of the present invention to provide a mask and/or an exposure method by which disturbance of periodicity such as described above can be reduced significantly.

In accordance with a first aspect of the present invention, there is provided a mask for multiple exposures, having a plurality of periodic patterns in which a relation $0.5S<D<1.5S$ is satisfied where S is the spacing between lines of a first periodic pattern of said plurality of periodic patterns and D is the spacing between the first periodic pattern and a second periodic pattern, of said plurality of periodic patterns, juxtaposed to the first periodic pattern with respect to the periodicity direction.

In accordance with a second aspect of the present invention, there is provided a mask for multiple exposure having a plurality of periodic patterns in which a relation $0.9S<D<1.1S$ is satisfied, where S is the spacing between lines of a first periodic pattern of said plurality of periodic patterns and D is the spacing between the first periodic pattern and a second periodic pattern, of said plurality of periodic patterns, juxtaposed to the first periodic pattern with respect to the periodicity direction.

In a third aspect of the present invention, in relation to the first or second aspect thereof, adjoining pattern portions (lines or spaces) of the first and second periodic patterns juxtaposed with each other may have opposite phases.

In accordance with a fourth aspect of the present invention, there is provided a mask having a plurality of periodic patterns, wherein adjoining pattern portions (lines or spaces) of first and second periodic patterns of them, juxtaposed with each other, have opposite phases.

In accordance with a fifth aspect of the present invention, there is provided an exposure method including a process for exposing a photosensitive substrate to any one of the masks as recited above.

In accordance with a sixth aspect of the present invention, there is provided a multiple exposure method including a first exposure process using any one of the masks as recited above, and a second exposure process using another mask.

In accordance with a seventh aspect of the present invention, there is provided an exposure apparatus having an exposure mode for performing a process according to an exposure method as recited above, and a different exposure mode.

In accordance with an eighth aspect of the present invention, there is provided a device manufacturing method, characterized by an exposure process for exposing a wafer to a device pattern by use of an exposure method as recited above, and a developing process for developing the exposed wafer.

In accordance with a ninth aspect of the present invention, there is provided a mask having periodic patterns, wherein each of the first and second periodic patterns has a unit pitch defined by a line and a space, wherein the first periodic pattern has a first pitch $P_1$ with a line width $L_1$ and a space width $S_1$ while the second periodic pattern has a second pitch $P_2$ with a line width $L_2$ and a space width $S_2$, wherein the first and second pitches $P_1$ and $P_2$ are different from each other, wherein the first and second periodic patterns are juxtaposed with each other with respect to the periodicity direction, with a spacing D, and wherein, when one of the line widths $L_1$ and $L_2$ of the first and second periodic patterns is taken as L while one of the space widths $S_1$ and $S_2$ of them is taken as S, a relation $0.5L \leq D \leq 1S+0.5L$ is satisfied where $L<S$ is satisfied, whereas a relation $0.5S \leq D \leq 1L+0.5S$ is satisfied where $S \leq L$ is satisfied.

In accordance with a tenth aspect of the present invention, there is provided a mask having first and second periodic patterns, wherein each of the first and second periodic patterns has a unit pitch defined by a line and a space, wherein the first periodic pattern has a first pitch $P_1$ with a line width $L_1$ and a space width $S_1$ while the second periodic pattern has a second pitch $P_2$ with a line width $L_2$ and a space width $S_2$, wherein the first and second pitches $P_1$ and $P_2$ are different from each other, wherein the first and second periodic patterns are juxtaposed with each other with respect to the periodicity direction, with a spacing D, and wherein the spacing D is equal to the space width $S_1$ and/or the space width $S_2$.

In accordance with an eleventh aspect of the present invention, there is provided a mask having a plurality of periodic patterns each having a unit pitch defined by a line and a space, wherein the plurality of periodic patterns include two periodic patterns having the same pitch and line width and being juxtaposed with each other with respect to the periodicity direction with a spacing D, and wherein, when the line width is L and the space width is S and when the spacing D is not equal to S, the spacing D is in a range which satisfies a relation $0.5L \leq D<S$ or a relation $S<D \leq 1S+0.5L$ where $L<S$ is satisfied, whereas the spacing D is in a range which satisfies a relation $0.5S \leq D<L$ or a relation $1S<D \leq L+0.5S$ where $S \leq L$ is satisfied.

In accordance with a twelfth aspect of the present invention, there is provided an exposure method including a process for exposing a photosensitive substrate to a mask as recited in relation to any one of the ninth to eleventh aspects of the invention described above.

In accordance with a thirteenth aspect of the present invention, there is provided a multiple exposure method including a first exposure process using a mask as recited in relation to any one of the ninth to eleventh aspects of the invention, and a second exposure process using another mask.

In accordance with a fourteenth aspect of the present invention, there is provided an exposure apparatus having an exposure mode for performing a process according to an exposure method as recited in relation to the twelfth or thirteenth aspect of the invention.

In accordance with a fifteenth aspect of the present invention, there is provided a device manufacturing method, characterized by an exposure process for exposing a wafer to a device pattern by use of an exposure method as recited in relation to the twelfth or thirteenth aspect of the invention, and a developing process for developing the exposed wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

First, an example of a dual exposure (multiple exposure) process to which a mask and an exposure method according to the present invention are applicable will be explained.

Figure 1:
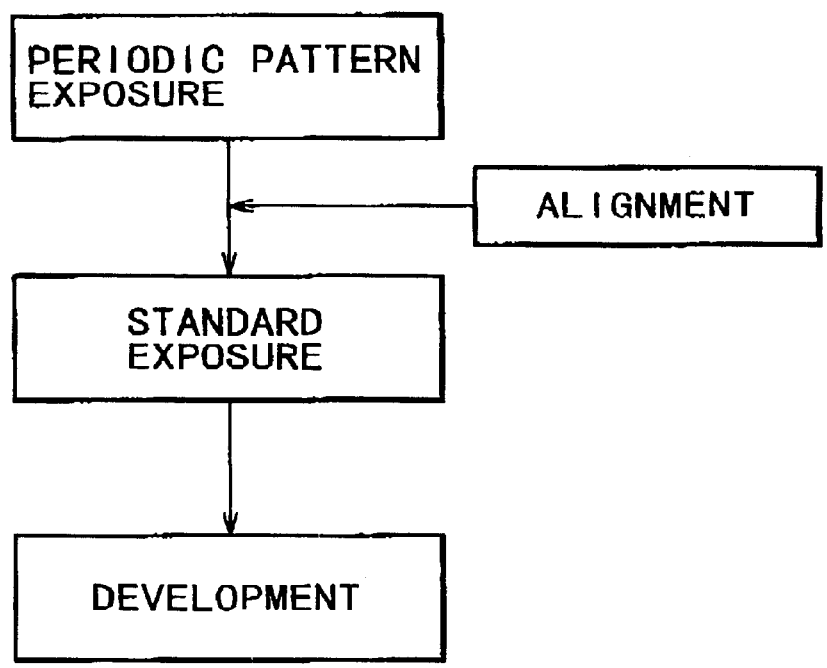
FIG. 1 is a flow chart for explaining a basic principle of an exposure method according to the present invention.

FIGS. 1–9B are schematic views for explaining the principle of an example of a dual exposure (multiple) exposure process. FIG. 1 is a flow chart which illustrates a basic exposure procedure. More specifically, FIG. 1 illustrates a periodic pattern exposure process and a projection exposure process (standard exposure process) both constituting a dual exposure procedure, and a development process following it, as well as the sequential flow of them. In FIG. 1, the order of the periodic pattern exposure process and the projection exposure process may be reversed. If one of these exposure processes include plural exposure steps, these exposure processes may be made alternately. There may be additional processes such as a fine alignment process, for example, to be performed between these exposure processes.

In an exposure method and exposure apparatus according to the present invention, a dual exposure (multiple exposure) procedure including a periodic pattern exposure and a standard exposure is performed to a substrate to be exposed (i.e., a photosensitive substrate).

Here, the term "dual exposure" refers to a procedure wherein a plurality of exposure processes are performed to a photosensitive substrate by use of different patterns, without intervention of a development process. Further, the term "standard exposure" refers to an exposure process by which an arbitrary pattern can be photoprinted although the resolution is lower than that of the periodic pattern exposure. A representative example of it is an exposure process wherein a mask pattern is projected through a projection optical system.

A pattern (standard pattern) to be photoprinted by a standard exposure may include a very fine pattern smaller than the resolving power, under the combination of a mask and an exposure apparatus to be used. A periodic pattern exposure functions to form a periodic pattern having a pattern of a linewidth similar to that of the very fine pattern. A large linewidth pattern beyond the above-described resolving power of the standard pattern exposure may be larger than the smallest linewidth of the pattern of the periodic pattern exposure, and the size is not specifically limited. However, a linewidth corresponding to a multiple of that smallest linewidth by an integer, for example, may be effective.

The pattern of the standard pattern exposure which is larger than the resolution may have any shape and may include pattern elements extending in various orientations. Usually, in an IC pattern, the pattern elements generally extend in two orthogonal directions, and in many cases the orientation of finest pattern elements of it is put on one of these two directions.

In a periodic pattern exposure in the dual exposure procedure, it is important that the lengthwise direction of the periodic pattern is registered with the lengthwise direction of the finest pattern elements of the standard pattern.

Also, the exposure should be done so that a peak (center) of an exposure amount distribution of a certain pattern component of the periodic pattern is registered with the center of the exposure amount distribution of the finest pattern component of the standard pattern, smaller than the resolution.

The term "dual exposure" in the present invention refers to a compound procedure of periodic pattern exposure and standard pattern exposure. The periodic pattern exposure may be done repeatedly, with its pattern placed in parallel to the orientation of the finest pattern component of the standard pattern exposure.

The periodic pattern exposure process and the standard pattern exposure process according to the exposure method and exposure apparatus of the present invention each may consist of a single exposure step or plural exposure steps. If plural exposure steps are included, each of the steps may provide different exposure amount distributions to a photosensitive substrate.

Figure 2A:
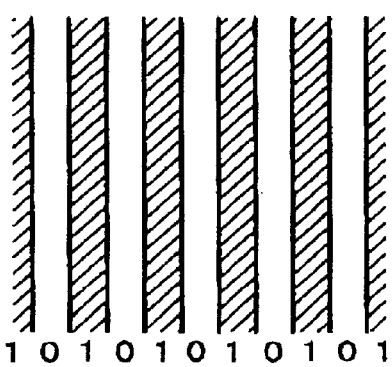
FIGS. 2A and 2B are schematic views, respectively, for explaining an exposure pattern to be produced by dual-beam interference exposure.
Figure 2A:
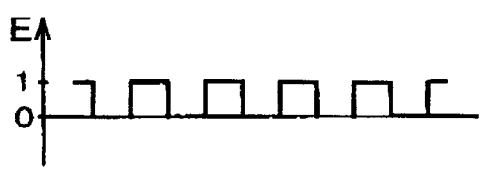

In an exposure operation according to the flow of FIG. 1, a periodic pattern exposure may be made first so that a periodic pattern such as shown in FIG. 2A is printed on a wafer (photosensitive substrate). Numerical values in the drawing depict exposure amounts. That is, the hatched portions in FIG. 2A corresponds to areas with an exposure amount 1 (practically, it is an arbitrary value), while blank portions represent areas with an exposure amount 0.

Figure 2B:
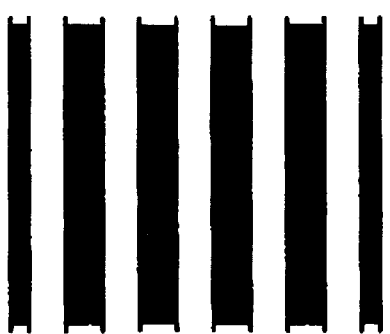
Figure 2B:
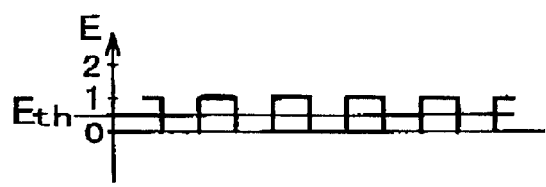

When such a periodic pattern only is to be developed after the exposure, usually, the exposure threshold $E_{th}$ of a resist material of the photosensitive substrate may be set between the exposure amount 1 and the exposure amount 0, as illustrated in the bottom graph of FIG. 2B. Illustrated in the upper portion of FIG. 2B is a lithography pattern (protruded pattern in a case where a negative type resist is used) to be produced finally through a development process under the so set condition and an etching process following it.

Figure 3A:
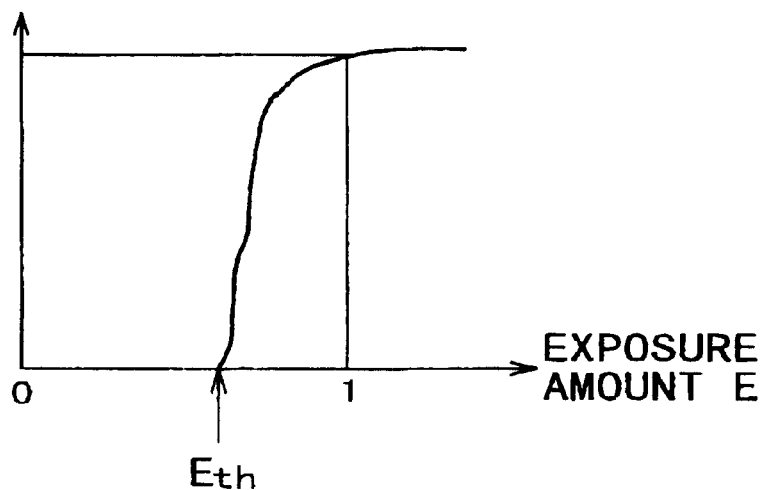
FIGS. 3A and 3B are graphs, respectively, each for explaining an exposure sensitivity characteristic of a resist.
Figure 3B:
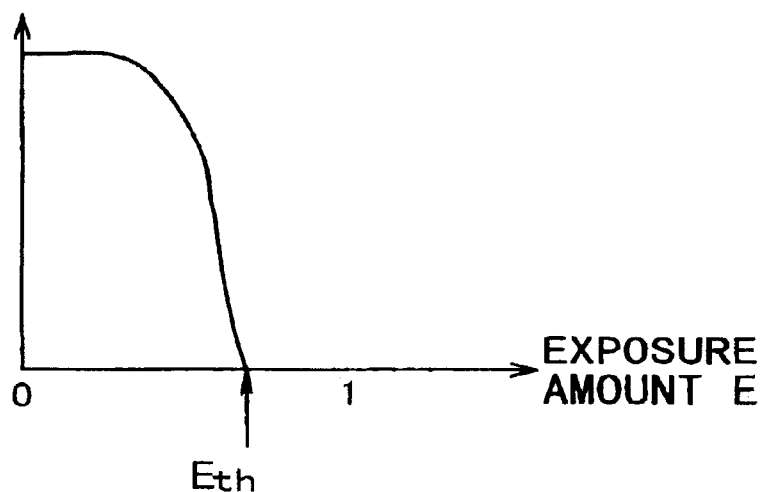

FIGS. 3A and 3B illustrate the relation between the exposure-amount-dependency of a resist film thickness and the exposure threshold level, in regard to the resist of the photosensitive substrate in this case. Specifically, FIGS. 3A and 3B concern the use of a negative type resist and a positive type resist, respectively. As illustrated, the film thickness d becomes equal to zero when the exposure amount is lower than the exposure threshold $E_{th}$ in the case of a negative type resist, whereas the thickness d becomes equal to zero when the exposure threshold $E_{th}$ is exceeded in the case of a positive type resist.

Figure 4:
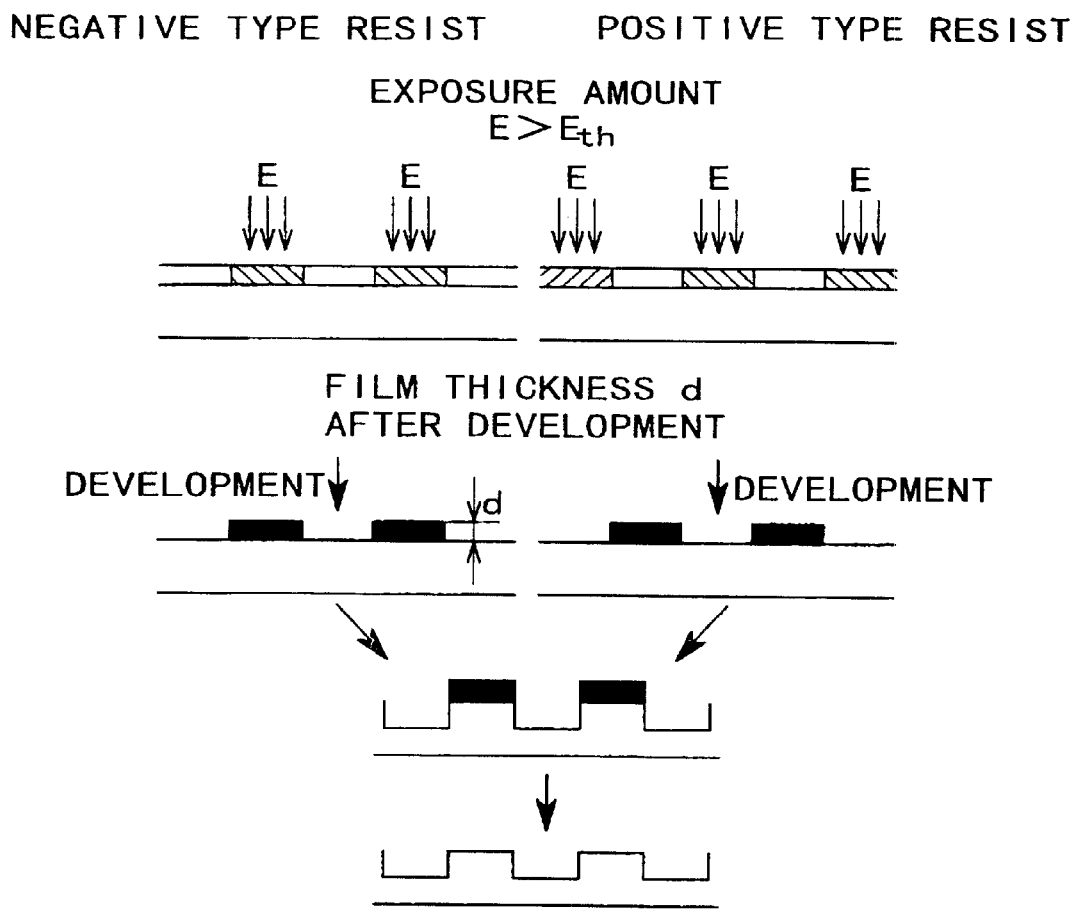
FIG. 4 is a schematic view for explaining a procedure for forming a pattern through a development process.

FIG. 4 is a schematic view, for explaining the procedure, in the cases of a negative type resist and a positive type resist, for forming a lithography pattern through an exposure process and a development process, such as described above, as well as an etching process following it.

Figure 5:
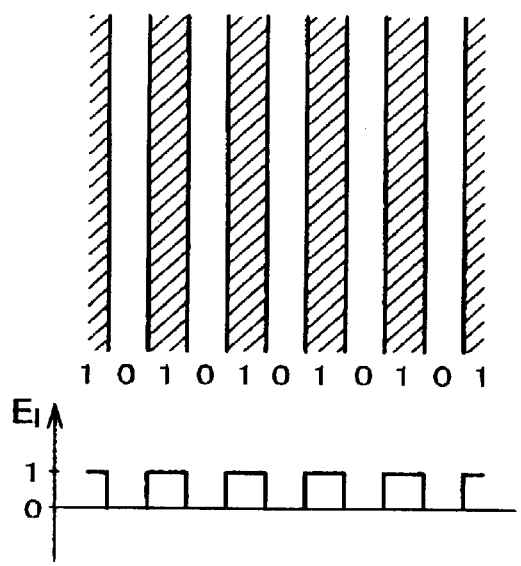
FIG. 5 is a schematic view for explaining an exposure pattern to be produced through a usual dual-beam interference exposure.
Figure 6:
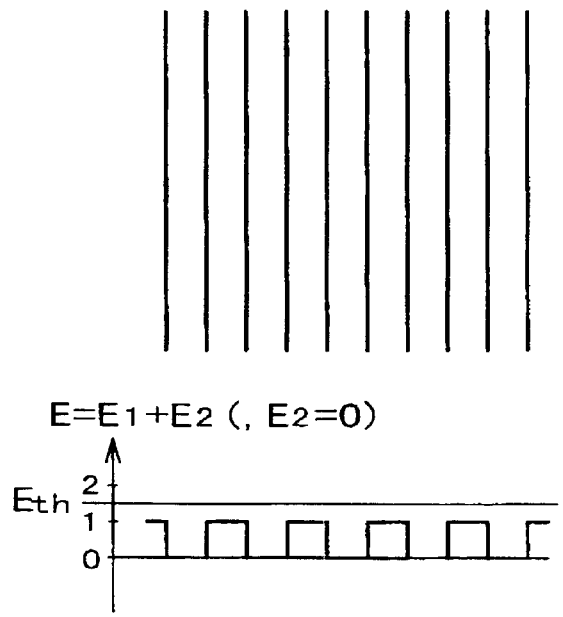
FIG. 6 is a schematic view for explaining an exposure pattern to be produced through a dual-beam interference exposure process according to the present invention.

In the present embodiment, the exposure sensitivity setting differs from the usual sensitivity setting described above. More specifically, as illustrated in the bottom of FIG. 5 (which is similar to FIG. 2A) and the bottom of FIG. 6, when the exposure amount at the center of each pattern in the periodic pattern exposure process is taken as 1, the exposure threshold $E_{th}$ of a resist of a photosensitive substrate is set to be larger than 1 but smaller than 2. With a photosensitive substrate having a threshold $E_{th}$ set such as above, when a development process is performed to an exposure pattern (exposure amount distribution) provided by a periodic pattern exposure only (as shown in FIG. 2A), because of an insufficient exposure amount there is produced no resist portion with a thickness zero although the resist film thickness varies to some extent. Thus, as shown in FIG. 6, a lithographic pattern would not be produced with an etching process. This can be considered to be disappearing of a periodic pattern. While the following description will be made in connection with the use of a negative type resist, the present invention is applicable also with the use of a positive type resist. In FIG. 6, $E_1$ at the bottom corresponds to the exposure amount in the periodic pattern exposure, while $E_2$ corresponds to the exposure amount in the standard projection exposure.

In this embodiment, a very fine exposure pattern which might be considered to disappear only with a periodic pattern exposure is mixed with an exposure pattern of an arbitrary shape, to be provided by a standard exposure and including a pattern of a size less than the resolution of an exposure apparatus, such that only a desired region is exposed selectively with an exposure amount not lower than the exposure threshold of a resist, whereby a desired lithography pattern corresponding to a circuit pattern is finally produced.

Figures 7A, 7B:
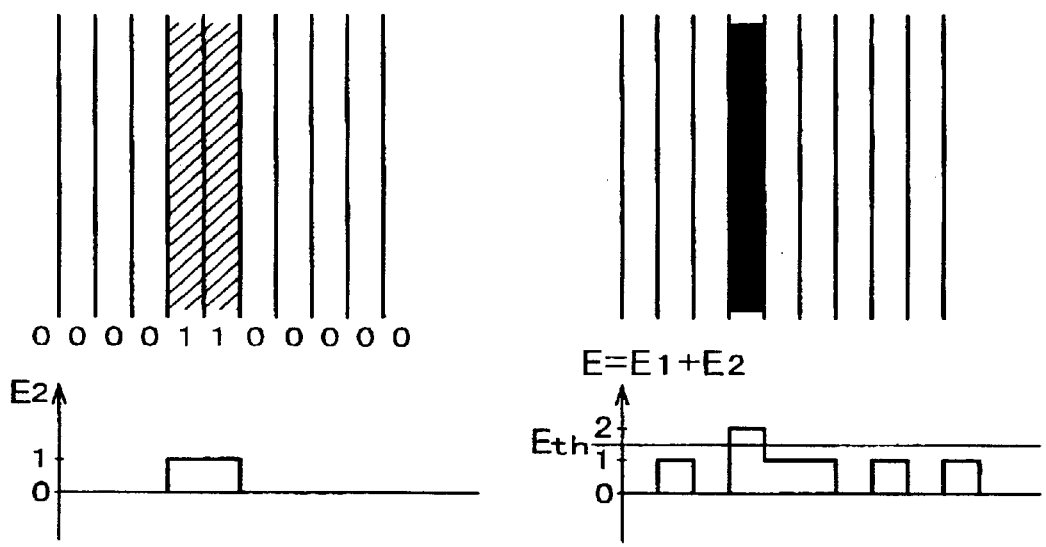
FIGS. 7A and 7B are schematic views, respectively, for explaining an example of an exposure pattern (lithography pattern) to be produced in accordance with the present invention.

FIG. 7A shows an exposure pattern to be provided by a standard projection exposure (standard exposure). Because of a very fine pattern, it is not resolved and thus the intensity distribution upon an object to be produced is blurred and expanded. In this embodiment, a very fine pattern of a linewidth about a half of the resolution of the projection exposure is used.

If the projection exposure with which the exposure pattern of FIG. 7A can be produced is performed after the periodic pattern exposure of FIG. 5, superposedly to the same region of the same resist without intervention of a development process, the total exposure amount distribution on this resist surface will be such as shown in the graph at the bottom of FIG. 7B. Since in this example the ratio between the exposure amount $E_1$ by the periodic pattern exposure and the exposure amount $E_2$ by the projection exposure is set to be 1:1, while the exposure threshold $E_{th}$ of the resist is set between the exposure amount $E_1$ (=1) and the sum (=2) of the exposure amount $E_1$ plus the exposure amount $E_2$, that is, between $E_1$ and $E_1+E_2$, a lithography pattern (protruded pattern in the case of a negative type resist) such as shown in the upper portion of FIG. 7B can be produced.

Here, the center of the standard pattern should be registered with the peak of the periodic pattern. Also, the orientation of the standard pattern should be placed in registration with that of the periodic pattern.

The isolated line pattern shown in the upper portion of FIG. 7B has a resolution based on that of the periodic pattern exposure, and it is not a simple periodic pattern. Thus, it can be said that a very fine pattern having a resolution higher than that as attainable with a single standard projection exposure process, is produced through the multiple exposure procedure.

Figure 8A:
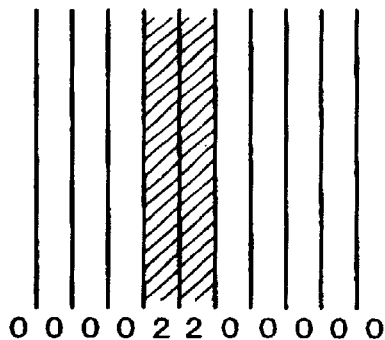
FIGS. 8A and 8B are schematic views, respectively, for explaining another example of an exposure pattern (lithography pattern) to be produced in accordance with the present invention.
Figure 8A:
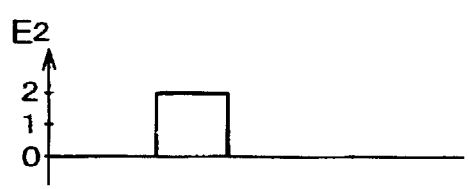

Here, as an example, a standard exposure with which an exposure pattern such as shown in FIG. 8A can be produced (e.g., projection exposure of a linewidth twice that of the exposure pattern of FIG. 5 and an exposure amount larger than the exposure threshold, here, an exposure amount twice the exposure threshold) may be performed after the periodic pattern exposure of FIG. 5, superposedly upon the same region of the same resist without intervention of a development process. In this procedure, the center of the exposure pattern of the standard exposure is placed in registration of the peak position of the exposure pattern of the periodic pattern exposure, such that the superposed patterns have a good symmetry and thus a good pattern image can be produced.

Figure 8B:
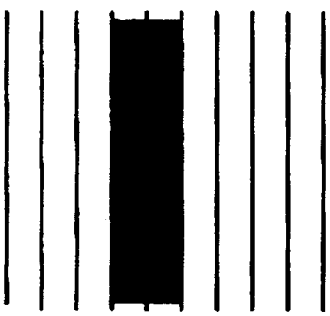
Figure 8B:
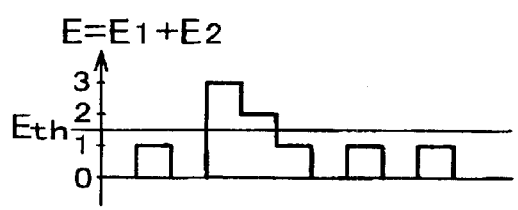

When such a multiple exposure procedure is performed, a total exposure amount distribution upon a resist will be such as shown at the bottom of FIG. 8B. The exposure pattern by the dual-beam interference exposure (periodic pattern exposure) disappears, and a lithography pattern (protruded pattern in the case of a negative type resist) such as shown in the upper portion of FIG. 8B is finally produced.

When the projection exposure is performed with a linewidth three times larger than the exposure pattern of FIG.

Figure 9A:
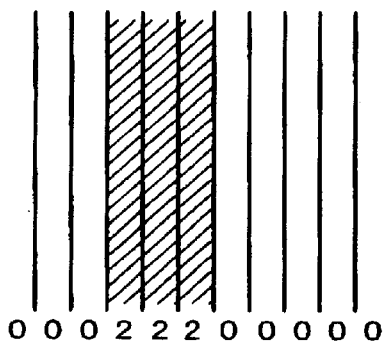
FIGS. 9A and 9B are schematic views, respectively, for explaining a further example of an exposure pattern (lithography pattern) to be produced in accordance with the present invention.
Figure 9A:
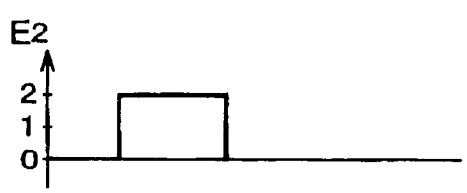
Figure 9B:
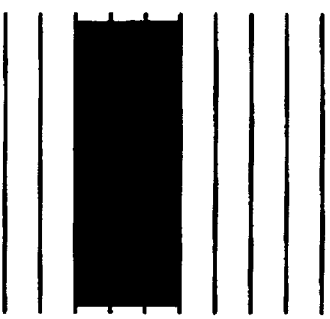
Figure 9B:
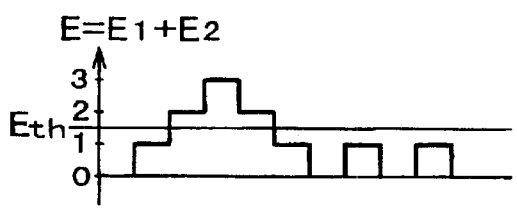

5 and an exposure amount larger than the exposure threshold, such as shown in FIG. 9A, the same principle applies. For an exposure pattern with a linewidth four times larger or more, since basically it is based on a combination of an exposure pattern of a double linewidth and an exposure pattern of a triple linewidth, the linewidth of a lithography pattern to be produced finally will be readily understood. In summary, any lithography pattern that can be produced by projection exposure can be formed with this embodiment.

By adjusting the exposure amount distributions (absolute value and distribution) through the periodic pattern exposure and the standard exposure having been described above as well as the resist threshold level of the photosensitive substrate, a circuit pattern which may comprise any combination of various patterns such as shown in FIGS. 6, 7B, 8B and 9B and which may have a smallest linewidth corresponding to the linewidth of a single pattern of the periodic pattern exposure (i.e., pattern of FIG. 7B), can be produced.

The principle of the exposure method described above may be summarized as follows.

(a1) A periodic pattern in an exposure region not exposed by standard exposure, i.e., with an exposure amount not greater than the exposure threshold level of the resist, will disappear as a result of a development process.

(a2) As regards the standard exposure pattern region having been exposed with an exposure amount not greater than the resist exposure threshold level, a pattern having a linewidth corresponding to a single pattern of periodic pattern exposure, as determined by the combination of the exposure pattern through the standard exposure and the exposure pattern through the periodic pattern exposures, is produced.

(a3) As regards the exposure pattern region of standard exposure having been exposed with an exposure amount not lower than the exposure threshold level, a pattern the same as the exposure pattern (corresponding to the mask pattern) is produced.

As a further advantage of the multiple exposure method described above, when a periodic pattern exposure process of highest resolving power is performed in accordance with the dual-beam interference exposure method, a depth of focus which is considerably larger than that as attainable with a standard exposure process can be accomplished.

While in the foregoing description the periodic pattern exposure is made first, the order of the periodic pattern exposure and the standard exposure may be reversed. The standard exposure may be made first or, alternatively, they may be made simultaneously.

A first preferred embodiment of the present invention will now be described.

Figure 10:
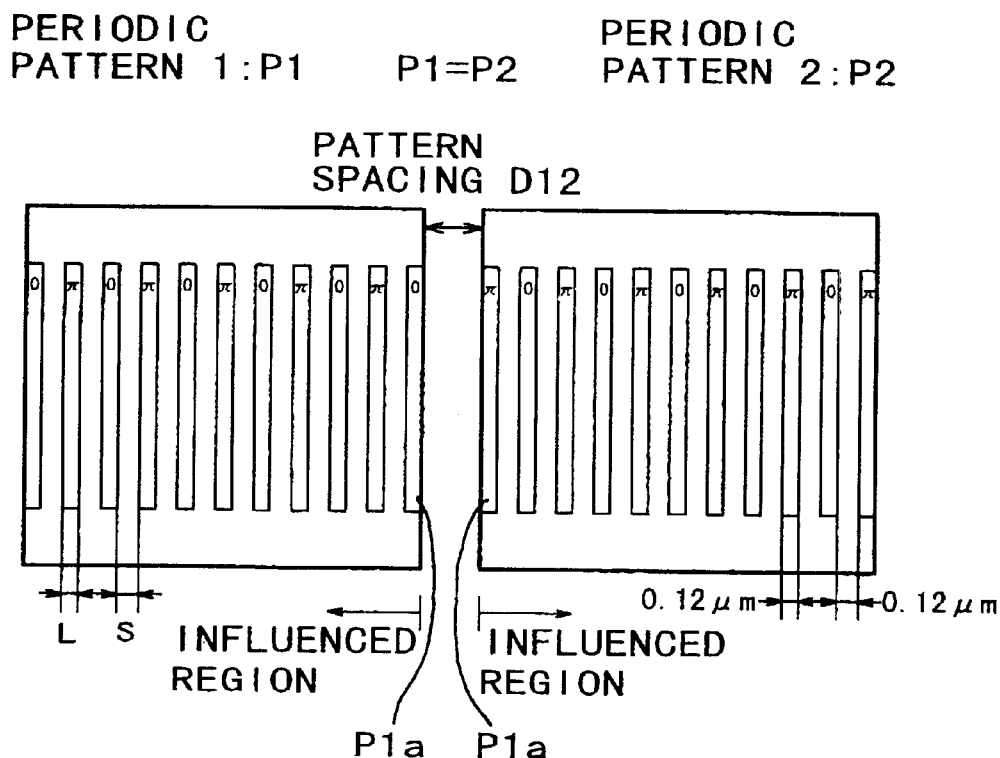
FIG. 10 is a schematic view of a periodic pattern in a first embodiment of the present invention.

FIG. 10 is a schematic view of a mask (reticle) having periodic patterns, according to a first embodiment of the present invention. This mask can be used when a periodic pattern exposure in a multiple exposure process is to be performed by use of a projection exposure apparatus. This embodiment is an example wherein periodic patterns 1 and 2 having the same pattern pitch are placed juxtaposed with each other with respect to the periodicity direction. In practice, the mask of this embodiment is formed with a plurality of periodic patterns, and FIG. 10 illustrates two of them. Each periodic pattern is formed with lines of a width L (hereinafter, "line L") and spaces of a width S (hereinafter "space S"), wherein each space corresponds to the spacing between adjacent lines. The lines and spaces are disposed alternately and periodically. Here, the pitch P of each periodic pattern is P=L+S. Each pattern comprises slits (light transmitting portions) with signs 0 and π in the drawing, and the remaining portions surrounding the slits are light blocking portions. The signs 0 and π denote the phases of lights transmitted through the slits.

Now, the embodiment will be described with reference to an example using a Levenson type phase shift mask wherein both of periodic patterns 1 and 2 have lines of a width L of 0.12 micron and spaces of a width S of 0.12 micron, and wherein patterns $P_{1a}$ and $P_{2a}$ at the boundary positions of these periodic patterns 1 and 2 have phases opposite to each other. The projection exposure will be done in this example while the mask is illuminated in accordance with partial coherent illumination of σ=0.2.

Since, in this example, both of the periodic patterns 1 and 2 have lines L and spaces S both being equal to 0.12 micron, if the spacing $D_{12}$ between the two periodic patterns 1 and 2 is made equal to 0.12 micron, of the same width as space S, there occurs no disturbance in periodicity about the boundary between the two periodic patterns. If, however, the spacing D of the two periodic patterns is other than 0.12 micron, there will occur a disturbance in periodic characteristic (i.e., characteristic of periodic pattern image) of the periodic patterns, at the boundary between them.

Figure 11:
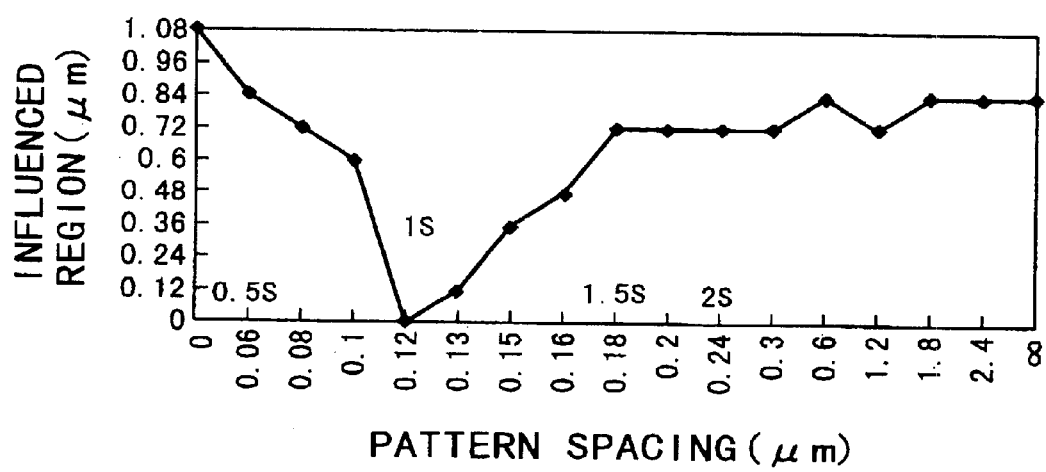
FIG. 11 is a graph for explaining the relation between the pattern spacing and the influence at the boundary, in the first embodiment of the present invention.

In order to examine the influence of such a disturbance in periodic characteristic, the relation between the spacing, between the periodic patterns, and those regions where the influence might appear was investigated. The graph of FIG. 11 shows the results. In the graph of FIG. 11, the spacing D between the periodic patterns is taken on the axis of the abscissa, while the distance of the region being influenced, from the boundary between the periodic patterns, as illustrated in FIG. 10, is taken on the axis of the ordinate. In this example, the "region being influenced" refers to a region where, as regards the reproducibility of the linewidth, a change of ±2.5% or more is caused with respect to a design linewidth of 0.12 micron or to a region where, as regards the contrast, there occurs a change of ±2.5% or more in the pattern contrast at the central portion of the periodic pattern. The influence of the boundary is most critical at the boundary portion and it reduces with a distance away from the boundary. Thus, the graph illustrates the range from the boundary, being influenced.

It is seen from FIG. 11 that, when the spacing D between the periodic patterns 1 and 2 is enlarged up to infinity, the influence of the boundary is applied up to a distance of 0.84 micron, whereas, when the spacing D between the periodic patterns is made smaller, the region being influenced becomes narrower, and that, as the spacing D between the periodic patterns is made just equal to 0.12 micron, the same as the space S, there occurs no influence of the boundary. As the spacing D is made still smaller, the region being influenced becomes wider and, with a spacing not greater than 0.5S (0.06 micron), the influence becomes larger than that with a spacing of infinity. Within a range of 0.5S to 1.5S, the influence is smaller as compared with that with a spacing of infinity.

Namely, it is seen that, if the spacing D between the periodic patterns is in a range from 0.5S (0.06 micron) to 1.5S (0.18 micron), the region to be influenced is narrower than that where the periodic patterns are placed away from each other by an infinite distance.

From the results described above, it is seen that the region to be influenced by the pattern boundary portion is changeable with the spacing D between the periodic patterns, and that the influence of the boundary is smaller as the periodic patterns are placed close to each other with a spacing of 0.5S to 1.5S, more preferably, 0.9S to 1.1S, than that as the periodic patterns are placed away from each other by an infinite distance.

The best may be a case where two periodic patterns 1 and 2 have a mutual spacing D being equal to S (0.12 micron). Practically, however, two periodic patterns cannot always be disposed with such a best distance. Usually, therefore, a good pattern will be produced that:

(A) The region to be influence is not used; or (B) Correction such as OPC is done, and a region very close to the boundary is used.

This will be described in more detail, below.

If two periodic patterns cannot be placed juxtaposed with each other, with a most preferable pattern spacing D equal to 1S (0.12 micron), one effective method is not to use the region to be influenced by the boundary, as suggested by the graph of FIG. 1.

Figure 12:
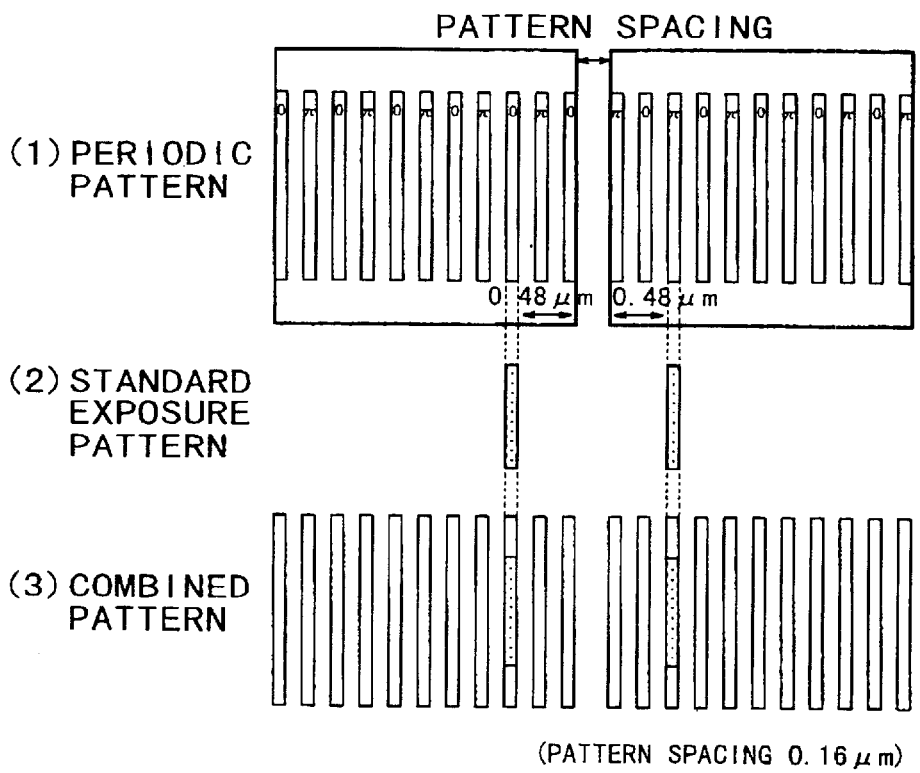
FIG. 12 is a schematic view of an example of periodic pattern disposition, according to the present invention.

FIG. 12 shows an example of a mask (reticle) wherein two periodic patterns are placed with a spacing D of 0.16 micron. This mask can also be used as the periodic pattern exposure described above is to be performed by use of a projection exposure apparatus, and signs in FIG. 12 correspond to those of FIG. 10. From FIG. 11, it is seen that, in a case of a pattern spacing D of 0.16 micron, the region where the influence of a boundary appears extends to a distance of 0.48 micron. In consideration of it, a standard exposure pattern may be placed at a position spaced by 0.48 micron away from the boundary, by which the influence can be avoided.

As described above, by placing a pattern of a mast for the standard exposure so as not to use the region, of the periodic pattern, which is to be influenced by the boundary, a superposed pattern image not influenced by the boundary can be produced through the multiple exposure process.

Next, some examples of pattern spacings to be considered specifically will be described. It should be noted here that, while in this embodiment the line width L and the space width S of the periodic patterns are made equal to 0.12 micron, they are not limited to it.

Figure 13:
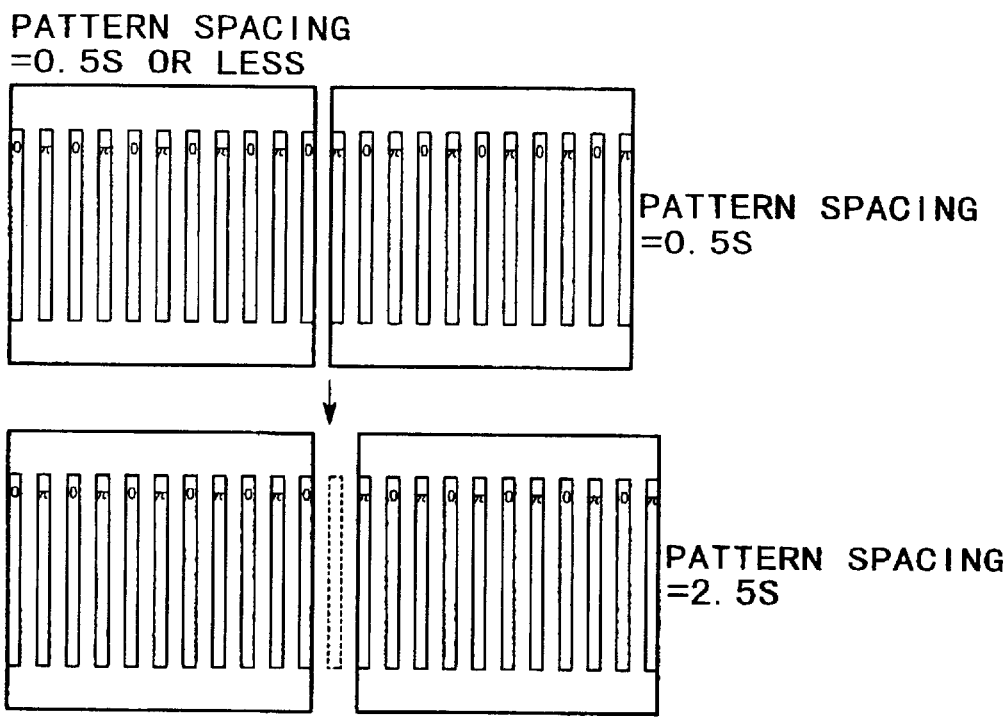
FIG. 13 is a schematic view of another example of periodic pattern disposition, according to the present invention.

(1) The spacing D between the periodic patterns is not greater than 0.5S (0.06 micron) (FIG. 11):

In this case, the influence of the boundary is larger than that as the spacing of the pattern is an infinite distance. Thus, as shown in FIG. 13, one pattern element of the periodic pattern may be omitted such that the spacing D between the two periodic patterns may become greater than 2S (0.24 micron) and not greater than 2.5S (0.28 micron). More specifically, while a case where the spacing D between periodic patterns is 0.5S is illustrated in the upper half of FIG. 13, by omitting one of the pattern elements constituting the periodic pattern, the spacing D is made up to 2.5S.

If the pattern spacing D becomes equal to 2S (0.24 micron), conditions to be described with reference to Case (4) below should be satisfied.

Figure 14:
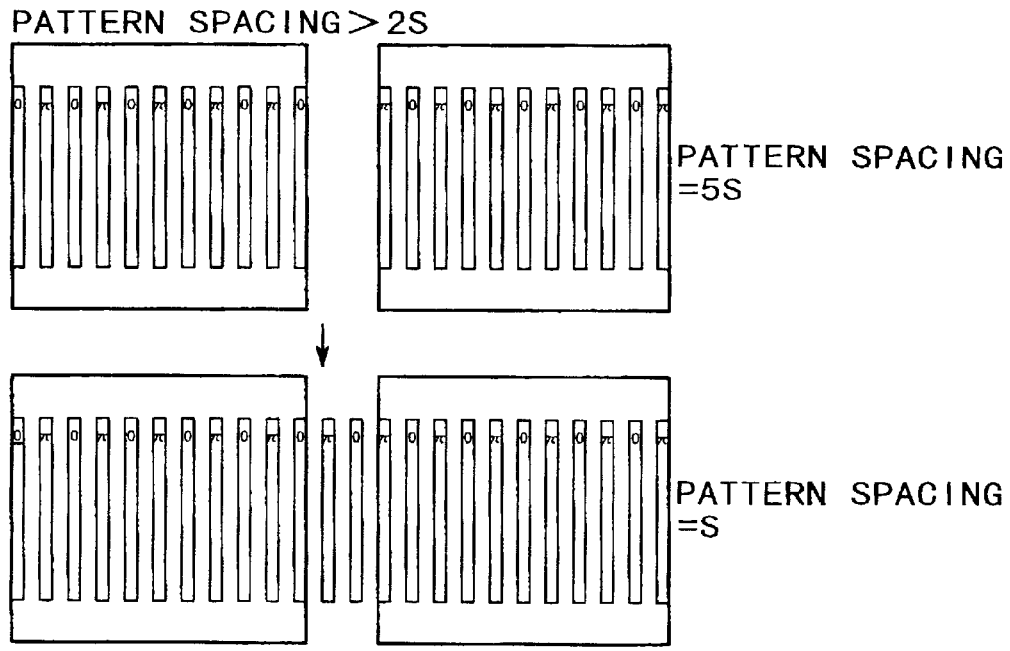
FIG. 14 is a schematic view of a further example of periodic pattern disposition, according to the present invention.
Figure 15:
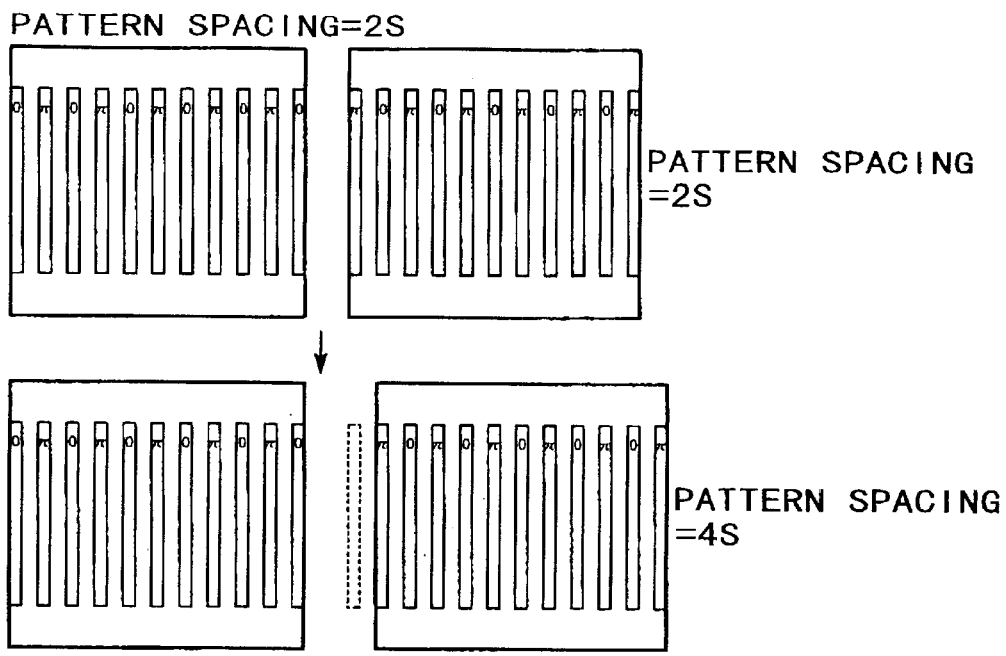
FIG. 15 is a schematic view of another example of periodic pattern disposition, according to the present invention.

(2) The spacing D is larger than 2S (0.24 micron):

If the spacing D between two periodic patterns is larger than 2S, as shown in FIG. 14, the number of pattern elements constituting the periodic pattern may be enlarged, such that the spacing D may become equal to 0.5S (0.06 micron) to 1.5S (0.18 micron). More specifically, in FIG. 14, a case wherein the spacing D is equal to 5S is illustrated in the upper half of the drawing. By adding two pattern elements like those of the periodic pattern, the spacing D is made equal to S as shown in the lower half of the drawing.

(3) The spacing D is in a range from 1.5S and 2S (light transmissive type mask):

Usually, for exposure of a circuit pattern, a negative type resist is used with a light transmission type mask having its pattern areas defined by light transmitting areas. Also, when a positive type resist is to be used for contact whole exposure, a transmission type mask, having its pattern areas defined by light transmitting areas, is used, too. If such a light transmission type mask has periodic patterns with a spacing D of 1.5S (0.18 micron) to 2S (0.24 micron), a particular note such as below should be paid.

Figure 16:
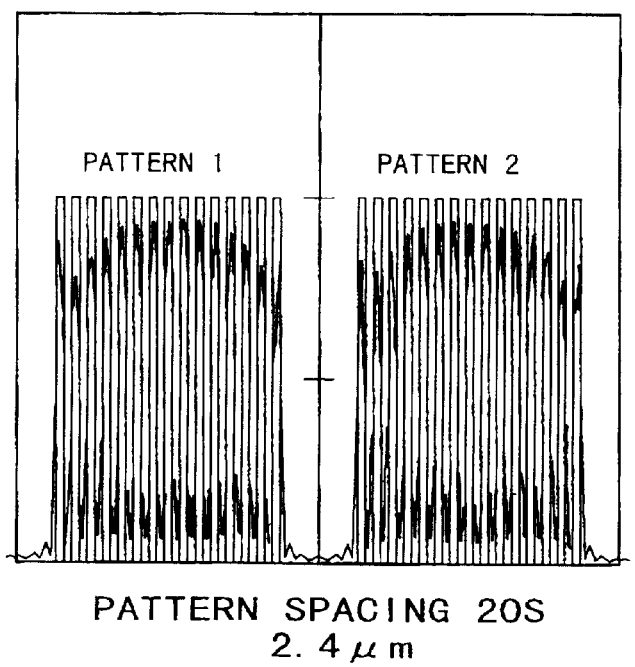
FIG. 16 is a schematic view for explaining a one-dimensional intensity distribution of a periodic pattern image, in the present invention.
Figure 16:
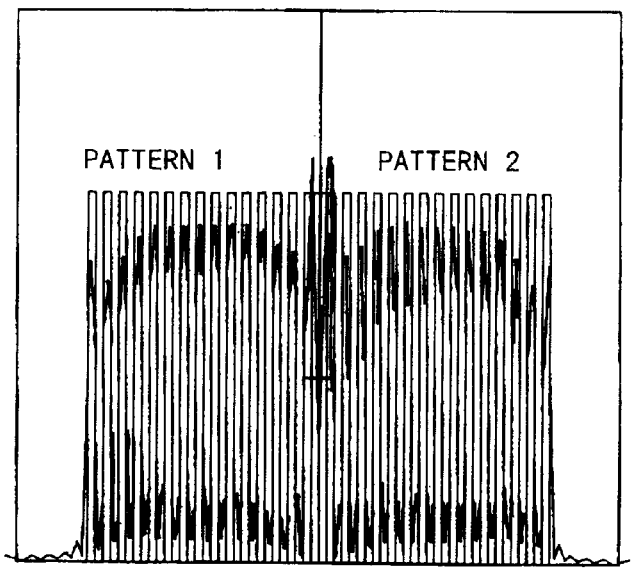

FIG. 16 shows a one-dimensional intensity distribution of a periodic pattern image, in a case where the spacing D of the periodic patterns is 2S (0.24 micron) and a case where the spacing D is 20S (2.4 microns). In the case of pattern spacing D=20S, two periodic patterns can be regarded as being isolated from each other. As compared therewith, when the spacing D=2S, it is seen that the intensity at the boundary portion is emphasized. Such tendency becomes more notable with a spacing D of 1.5S or more, and it is most notable with a spacing D=2S. Further, the phenomenon is larger with a narrower linewidth.

When such a light transmission type mask is used, since an image of a design pattern is formed at a portion where the light intensity is strong, if the intensity is emphasized at the boundary, the pattern is emphasized only there. Therefore, in the dual exposure procedure, the boundary portion will undesirably be reproduced as an image. As regards a light blocking type mask, on the other hand, since an image of a design pattern is formed at a portion where the light intensity is close to zero, such an inconvenience is not caused.

For the reasons described above, when a light transmission type mask having periodic patterns with a spacing D of 1.5S to 2S is used, disposition of the patterns should be changed or, alternatively, the illumination condition for dual exposure or the light quantity ratio during the exposure should be optimized so as to avoid that the light intensity at the boundary portion of the patterns is too strong.

(4) The spacing D is equal to 2S (0.24 micron):

The spacing D between periodic patterns should not be made equal to 2S (0.24 micron), that is, a unit pitch, as much as possible. This is because, as illustrated in FIG. 16, the emphasis of light intensity at the boundary is most notable with a spacing D of 0.24 micron. Additionally, both the contrast and the linewidth change largely as compared with those of isolated patterns. If the spacing D of the periodic patterns is 2S, one pattern element of one of the two periodic patterns may be omitted, such that the spacing D may become equal to 4S (0.48 micron).

In summary, when two periodic patterns having the same line width L and the same space width S as well as the same pitch are to be placed juxtaposed with each other with respect to the periodicity direction or when two periodic patterns are to be placed juxtaposed with each other while their adjoining line patterns $P_{1a}$ and $P_{2a}$ to be placed at the boundary have opposite phases with each other, these periodic patterns may most preferably be disposed with a spacing D just equal to the space width S. If such a disposition is not attainable, the spacing may preferably be set at least in a range of 0.5S to 1.5S where S is the space width.

If the spacing D of two periodic patterns is not greater than 0.5S, one pattern element of one of the two periodic patterns may be omitted, such that the spacing D may become larger than 2S and not larger than 2.5S where S is the space width. If the spacing D is 2S, one pattern element of one of the two periodic patterns may be omitted, such that the patterns may be disposed with a spacing D=4S. If the spacing D is wider than 2S, a similar pattern element or elements may he added such that the spacing D may become not less than 0.5S and not greater than 1.5S. In a case of a light transmission type mask and if the spacing between periodic patterns is 1.5S to 2S where S is the space width, particular attention should be paid in regard to the light quantity ratio and/or illumination condition, for example, in the dual exposure procedure.

The foregoing description has been made with reference to examples of periodic patterns having a resolution limit with a linewidth $K_1$ factor of 0.29 and a pitch $K_1$ factor of 0.58. If the spacing between the periodic patterns is large such that they can be regarded as being isolated patterns, the influence may apply up to a region spaced 7L from the boundary. Thus, in a portion of a large pitch, the influence of the boundary reduces gradually. With a linewidth $K_1$ factor of 0.36 and a pitch $K_1$ factor of 0.73, the influence of the boundary may apply up to a region of 4L. Although the foregoing description has been made with reference to examples wherein both the line width L and the space width S are equal to 0.12 micron, similarly it applies to a case of 0.24 pitch where the line width L and the space width S are different from each other. If L<S, a range of $0.5L \leq D \leq S+0.5$ is preferable. If $S \leq L$, a range $0.5S \leq D \leq L=0.5S$ is preferable. Here, the factor $K_1$ can be determined by an equation:

$$K_1 = L \times (NA/\lambda)$$

where L is the smallest linewidth of the pattern or the smallest pitch of the pattern, NA is the numerical aperture of the illumination optical system, and λ is the wavelength.
(B) Doing Optical Proximity Correction to use a region to be influenced:

In a case wherein periodic patterns cannot be disposed with a most preferable spacing, pattern correction based on optical proximity effect correction (OPC) may be performed in accordance with the influence level of the boundary portion, to enable use of a region very close to the boundary.

Figure 17A:
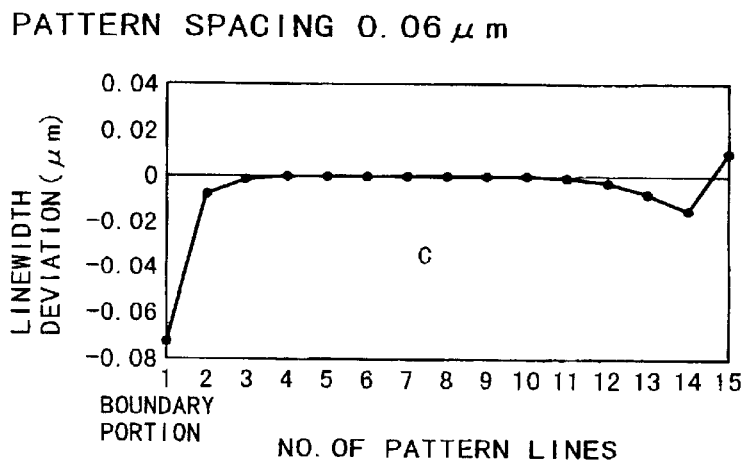
FIGS. 17A, 17B and 17C are graphs, respectively, for explaining a pattern spacing and a linewidth error from a design value.
Figure 17B:
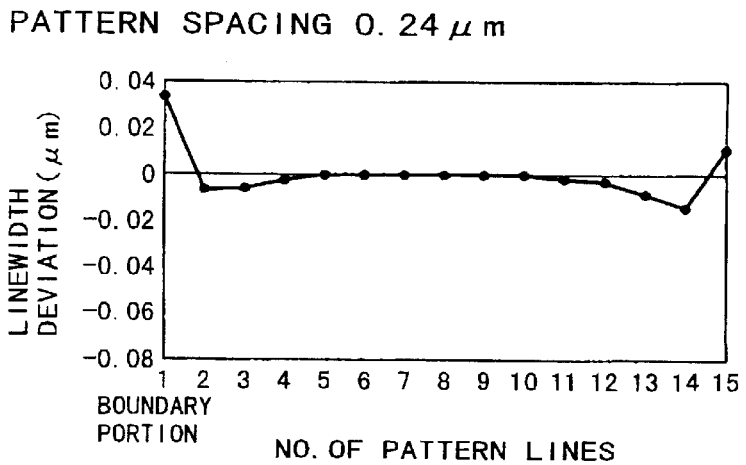
Figure 17C:
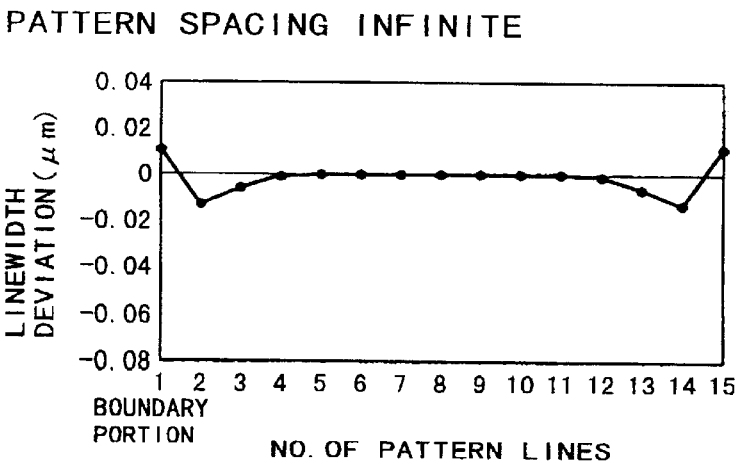

FIGS. 17A, 17B and 17C each shows the relation between the pattern spacing and an error of linewidth from a design value, in regard to cases where the pattern spacing D of FIG. 10 is 0.06 micron, 0.24 micron and infinity. The number of pattern elements (lines) is taken on the axis of the abscissa, while errors in the linewidth design value (0.12 micron) of the periodic pattern are taken on the axis of the ordinate.

It is seen from FIGS. 17A–17C that, when the pattern spacing is infinite, an error of linewidth with respect to the design value is produced for three lines from the boundary side end. This error in the linewidth is the result of influence at the boundary. In consideration of it, pattern correction such as OPC, for example, may be done while taking into account the linewidth error which appears along the axis of the ordinate, by which the influence of the boundary can be avoided.

An example of OPC will be described below.

As described with reference to FIGS. 17A–17C, if the spacing D of the periodic patterns is infinite, a linewidth error occurs in the three lines from the boundary. More specifically, it is seen from the drawings that, as compared with the design linewidth of 0.12 micron, the first line has an error +0.01, the second line has an error −0.01 and the third line has an error −0.005. Therefore, by preparing a mask (reticle) with periodic patterns where the linewidth correction is made to the first line as 0.12−0.01, the second line as 0.12−0.01, and the third line as 0.12+0.005, in terms of image plane transform, it is possible to prevent the influence of the boundary from being reflected to the pattern. It is to be noted here that the center of the pattern should he held as the case without correction, and that the spacing of the patterns should be adjusted so that the pitch of the three lines is kept the same as the whole periodic pattern pitch.

While the amount of OPC is determined in this example in accordance with the linewidth errors with respect to the design value, the determination method is not limited to it. Further, the OPC may be made in relation to correction for either the periodic pattern or the standard exposure pattern.

Further, although this embodiment has been described with reference to examples wherein two periodic patterns have the same pitch and the same line width L and space width S, this is not a requisition. If the line width and the space width differ from each other, the sign S referred to above in relation to various conditions should be construed as one of the width of a line and the width of a space.

In this embodiment, pattern elements at the boundary portion have opposite phases. If, to the contrary, pattern elements at the boundary portion between two periodic patterns have the same phase, the patterns cannot be resolved when they are placed close to each other beyond 2S, and the pattern light intensity is emphasized at the boundary. Thus, the spacing between the periodic patterns should be made equal to 2S or more. Additionally, using opposite phases is effective to make the pattern tight.

A mask according to a second preferred embodiment of the present invention will be described below.

Figure 18:
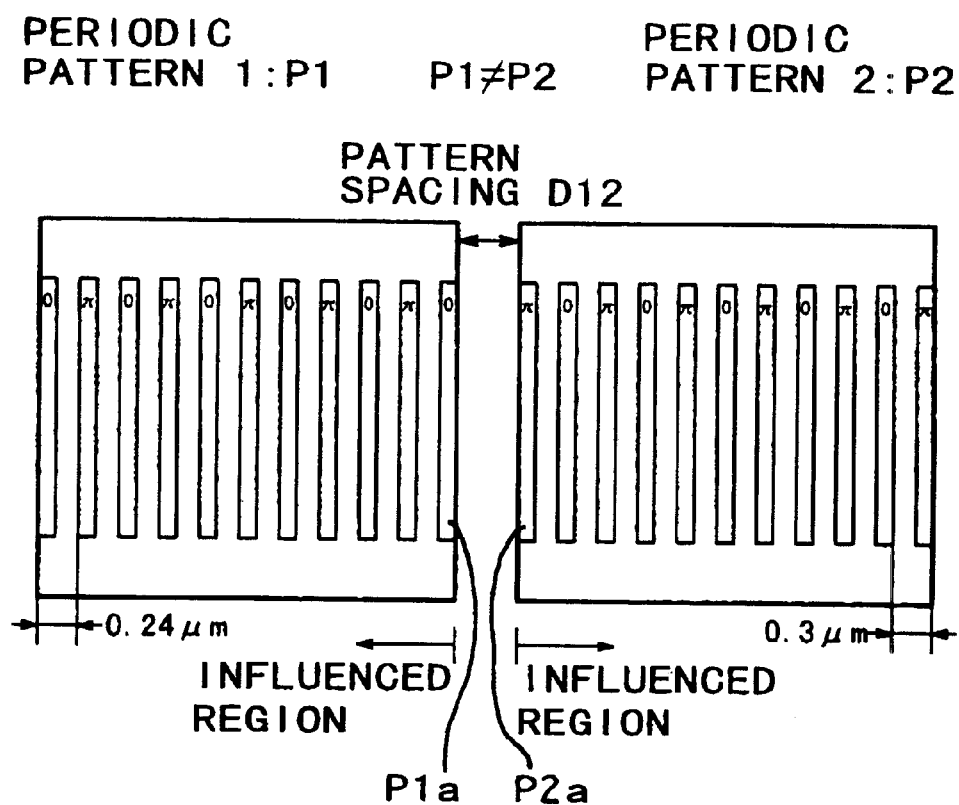
FIG. 18 is a schematic view of a periodic pattern in a second embodiment of the present invention.

In this embodiment, two periodic patterns having different pitches are placed juxtaposed with each other with respect to the periodicity direction. FIG. 18 is a schematic view of it. In this example, the mask has a phase shift type mask pattern which comprises a periodic pattern 1 having a pitch of 0.24 micron and a periodic pattern 2 having a pitch of 0.3 micron. The pattern elements $P_{1a}$ and $P_{2a}$ at the boundary portion between these patterns comprise linear pattern elements of opposite phases. The mask is to be illuminated, for projection exposure, in accordance with partial coherent illumination of σ=0.2. The periodic patterns 1 and 2 are defined by lines and spaces, like the preceding embodiment, wherein the width L of each line is equal to the width S of each space. In an example, the pitch of 0.24 micron is defined by a 0.12L/S (micron) pattern, and the pitch of 0.3 micron is defined by a 0.15L/S (micron) pattern. However, the line-and-space pattern is not limited to it.

Figure 19A:
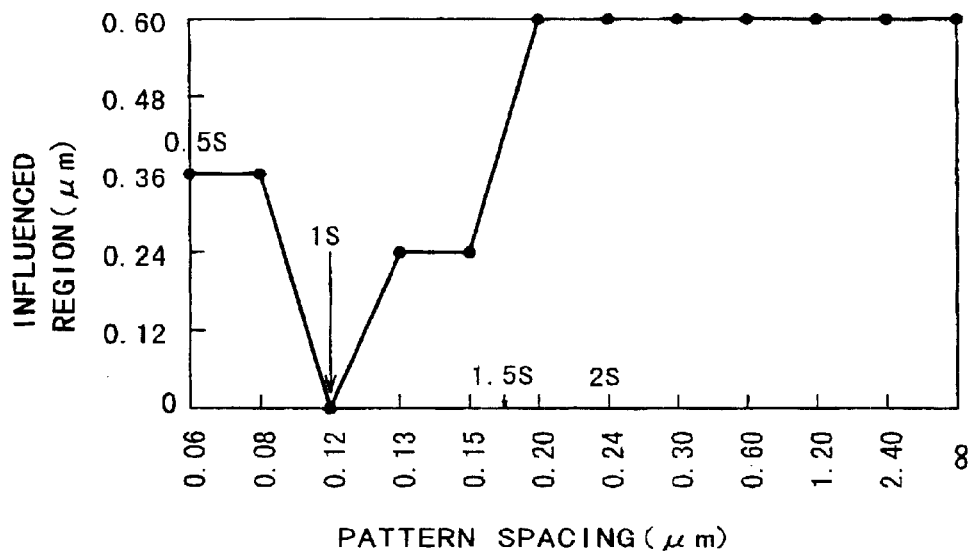
FIGS. 19A and 19B are graphs, respectively, for explaining the relation between the spacing of patterns of different pitches and the influence at the boundary of them.
Figure 19B:
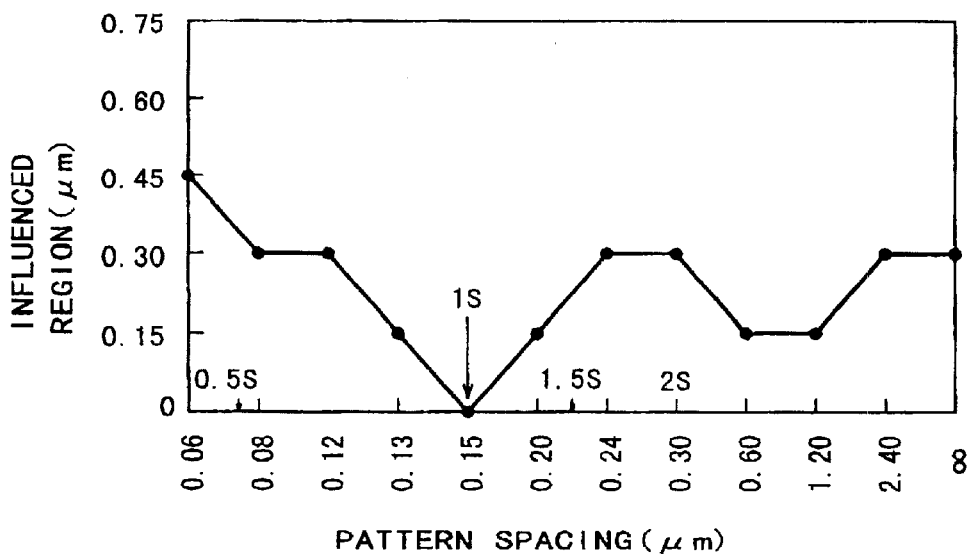

FIGS. 19A and 19B show the results of examination made to the relation between the pattern spacing D and the region where the influence of the boundary appears. In the graphs of FIGS. 19A and 19B, the pattern spacing D is taken on the axis of the abscissa, while the region being influenced by the boundary is taken on the axis of the ordinate. In this example, the "region being influenced" refers to a region where, as regards the reproducibility of the linewidth, a change of ±2.5% or more is caused with respect to a design pitch of 0.24 micron or 0.3 micron or to a region where, as regards the contrast, there occurs a change of ±2.5% or more in the pattern contrast at the central portion of the periodic pattern. The influence of the boundary is the most critical at the boundary portion and it reduces with a distance away from the boundary. Thus, each graph illustrates the range from the boundary, being influenced. FIG. 19A concerns the influence upon the periodic pattern 1 of 0.24 pitch, and FIG. 19B concerns the influence upon the periodic pattern 2 of a pitch of 0.3 micron.

It is seen from FIG. 19A that, when the spacing D between the periodic patterns 1 and 2 is enlarged up to infinity, the influence of the boundary on the 0.24 pitch pattern is applied up to a distance of 0.6 micron, whereas, when the spacing D between the periodic patterns is made smaller, the region being influenced becomes narrower, and that, as the spacing D between the periodic patterns is made just equal to 0.12 micron, the same as the space width S of the 0.24 pitch periodic pattern 1, there occurs no influence of the boundary. As the spacing D is made still smaller, than the space width S, the region being influenced becomes wider. The same applies to the influence of the boundary upon the 0.3 pitch periodic pattern 2.

From FIGS. 19A and 19B, it is seen that the region where the influence of the boundary between periodic patterns appears varies in dependence upon the spacing between the patterns, and that, if the spacing between the periodic patterns is not equal to the smaller unit pitch (0.24 micron), even for patterns of different pitches, the influence of the boundary becomes smaller as the patterns are placed closer within a certain range as has been described with reference to the first embodiment.

As regards the periodic pattern 1 of 0.24 micron pitch, the influence is minimized when the spacing D is made equal to the space width S (0.12 micron) of the periodic pattern 1. In this example, it is 0.12 micron. Similarly, as regards the periodic pattern 2 of 0.3 micron pitch, the influence is minimized when the spacing D is made equal to the space width S (0.15 micron) of the periodic pattern 2. In this example, it is 0.15 micron. However, since the influence of the boundary is larger with a smaller linewidth, when periodic patterns of different pitches are to be juxtaposed with each other, the spacing between them may desirably be made equal to the space width of one of the periodic patterns having a smaller pitch.

Patterns cannot always be placed with a best spacing such as described above. In such a case, like the first embodiment, use of the region to be influenced may not be used or pattern correction such as OPC, for example, may be made, in accordance with the results shown in FIGS. 19A and 19B. When the region to be influenced is not used, the pattern disposition may be adjusted, like the first embodiment.

In some examples to be described below, a symbol "1P" corresponds to the sum of the line width L and the space width S. Thus, "2P" corresponds to the length of two pitches of a periodic pattern. In connection with the first embodiment, 2S corresponds to 1P.

If the spacing D between two periodic patterns is made smaller than a half of the space width S, the influence of the boundary becomes notable as compared with a case where the patterns are spaced much from each other and they are isolated from each other. Thus, one pattern element of one of the periodic patterns, at the boundary portion between them, should be omitted to thereby enlarge the spacing between them. However, the pattern spacing should not be made just equal to 1P.

When periodic patterns are juxtaposed with each other with a spacing of 1P, a particular attention should be paid. For, the emphasis of light intensity in the pattern at the boundary position thereof is most notable in this case. Additionally, both the contrast and the linewidth change largely, as compared with isolated patterns. If the pattern spacing is equal to 1P, one pattern element of one of the periodic patterns at the boundary between them should be omitted, so that the spacing D becomes equal to 2P.

If the spacing D is larger than 2P, the number of elements of one of the periodic patterns may be enlarged, so as to satisfy a relation $0.5L \leq D \leq S+0.5L$ where $L<S$ or a relation $0.5S \leq D \leq 1L+0.5S$ where $S \leq L$.

Further, in a case where a light transmission type mask as described hereinbefore is used and where the spacing D of the periodic patterns is in a range from $S+0.5L$ to $1P$ under a line and space relation of $L<S$ or in a range from $1L+0.5S$ to $1P$ under a relation $S \leq L$, there is a possibility of light intensity emphasis in the pattern portion at the boundary. In consideration of it, the illumination condition for dual exposure or the light quantity ratio during the exposure should be optimized so as to prevent that the light intensity at the boundary portion is too strong.

In summary, when periodic patterns having different pitches and having pattern elements of opposite phases, at the boundary of them, are to be placed juxtaposed with each other, the spacing D between them should most preferably be made equal to the space width of one of the periodic patterns. If such a disposition is not attainable, the spacing should desirably be adjusted to satisfy a relation $0.5L \leq D \leq 1S+0.5L$ where $L<S$, or a relation $0.5S \leq D \leq 1L+0.5S$ where $S \leq L$.

If the spacing D is not greater than 0.5S, one pattern element of one of the periodic patterns at the boundary of them may be omitted to expand the spacing between them. If the spacing D is equal to 1P, one pattern element of one of the periodic patterns at the boundary may be omitted so that the spacing D becomes equal to 2P. Further, if the spacing D is larger than 1P, a pattern element or elements may be added to the boundary portion of one of the periodic patterns to enlarge the same, such that a relation $0.5L \leq D \leq 1S+0.5L$ is satisfied where $L<S$, or a relation $0.5S \leq D \leq 1L+0.5S$ is satisfied where $S \leq L$.

In a case where a light transmission type mask as described hereinbefore is to be used and where the spacing D of the periodic patterns is in a range from $S+0.5L$ to $1P$ when $L<S$ or it is in a range from $1L+0.5S$ to $1P$ when $S \leq L$, the illumination condition for dual exposure or the light quantity ratio during the exposure should be adjusted, as in the first embodiment.

As regards pattern correction based on OPC, for example, to enable use of a region very close to the boundary although a detailed description is omitted here, the pitch correction may be done by correcting the pitch itself without changing the whole pitch, or it may be done by adjusting the line-and-space. The correction may be made in regard to either the periodic pattern or the standard exposure pattern.

A mask according to the embodiments described above has the following features.

(b1) When two periodic patterns are to be formed in juxtaposition upon a mask, for use in a dual exposure procedure including a standard exposure and a periodic pattern exposure process, pattern portions of them at the boundary may have opposite phases.

(b2) When two periodic patterns each having a unit pitch defined by a line and a space are to be placed juxtaposed with each other with respect to the periodicity direction, the spacing between them may be made equal to the space width S of one of the periodic patterns.

(b3) When two periodic patterns each having a unit pitch defined by a line and a space are to be placed juxtaposed with each other with respect to the periodicity direction, and if the spacing D between them is not greater than 0.5S where S is the space width of one of the periodic patterns, one pattern element of one of the periodic patterns, at the boundary portion, may be omitted to expand the spacing D.

(b4) When two periodic patterns each having a unit pitch defined by a line and a space are to be placed juxtaposed with each other with respect to the periodicity direction, and if the spacing between them is equal to the pitch of one of the periodic patterns, one pattern element (line) of one of them at the boundary may be omitted so that the spacing D becomes equal to 2P.

(b5) When two periodic patterns each having a unit pitch defined by a line and a space are to be placed juxtaposed with each other with respect to the periodicity directions and if the spacing D between the periodic patterns is larger than the pitches of them, a line or lines may be added to one of the periodic patterns at the boundary portion of it to expand the same, so that a relation $0.5S \leq D \leq L+0.5S$ may be satisfied, where S is the space width of the periodic pattern and L is the line width of it.

(b6) When two periodic patterns each having a unit pitch defined by a line and a space are to be placed juxtaposed with each other with respect to the periodicity direction, and if the two patterns comprise light transmission type patterns and the spacing D is $L+0.5S \leq D \leq 1P$, one pattern element (line) of one of the periodic patterns may be omitted to expand the spacing D.

(b7) If the two periodic patterns juxtaposed with each other have the same pitch and the same line width and space width, constituting the pitch, or if they are different from each other, the principle described above applies similarly.

(b8) When dual exposure of standard exposure and periodic pattern exposure is to be done to a substrate to be exposed, and if the periodic pattern exposure uses two periodic patterns juxtaposed with each other with respect to the periodicity direction, a portion where an influence of the boundary between them appears may not be used for the pattern formation based on the dual exposure.

(b9) When dual exposure of standard exposure and periodic pattern exposure is to be done to a substrate to be exposed, and if the periodic pattern exposure uses two periodic patterns juxtaposed with each other with respect to the periodicity direction, pattern correction such as OPC may be made performed for either the periodic pattern exposure or the standard exposure in regard to the pattern formation based on the dual exposure of such a region where an influence of the boundary appears.

Figure 20:
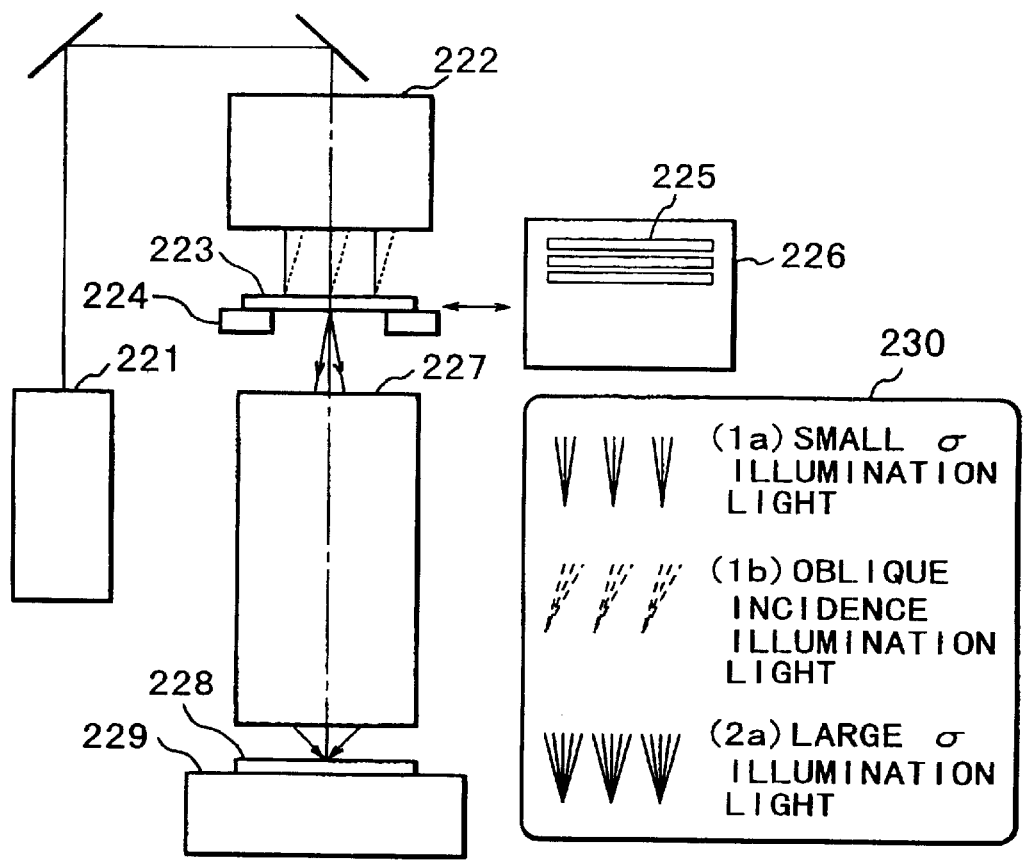
FIG. 20 is a schematic view of a main portion of an exposure apparatus according to the present invention.

FIG. 20 is a schematic view of a main portion of a high-resolution exposure apparatus, with which both a periodic pattern exposure process based on dual-beam interference exposure and a standard exposure process can be performed. This exposure apparatus has an exposure mode for performing a multiple exposure procedure based on these exposure processes, and another exposure mode for performing a single exposure according to the standard exposure process. These operation modes can be selected as desired. A mask or reticle such as described hereinbefore is used in the multiple exposure mode.

Denoted in FIG. 20 at 221 is a KrF excimer laser or an ArF excimer laser, each being able to produce exposure light of a wavelength not longer than 250 nm. Denoted at 222 is an illumination optical system, and denoted at 223 is a mask or a reticle. Denoted at 224 is a mask stage. Denoted at 227 is a projection optical system for projecting a circuit pattern formed on the mask 223 onto a wafer 228, in a reduced scale. Denoted at 225 is a mask (reticle) changer which has a function for selectively supplying one of a standard type reticle and a Levenson type phase shift mask (reticle), as described hereinbefore, into the mask stage 224.

The mask stage has a function for rotating a mask thereon in accordance with information as recorded in a bar code, for example, formed on that mask, in order to establish registration (parallelism) between the lengthwise direction of a fine pattern of a reticle, for standard exposure, and the lengthwise direction of periodic patterns for periodic pattern exposure.

Denoted at 229 in FIG. 20 is an integral X-Y-Z stage which can be used both for the periodic pattern exposure and the standard exposure. The X-Y-Z stage 229 is movable along a plane orthogonal to the optical axis of the optical system 227 and also along the optical axis direction. The position of the stage 229 can be controlled precisely, by use of a laser interferometer, for example.

While not shown in the drawing, the exposure apparatus of FIG. 20 includes a reticle alignment system and a wafer alignment system which may comprise an off-axis alignment optical system, a TTL alignment optical system and/or a TTR alignment optical system.

The illumination optical system 222 of the exposure apparatus shown in FIG. 20 has a structure with which the value of σ (sigma) of coherency in the partial coherent illumination is made variable. Thus, for small σ partial coherent illumination described above (σ is about 0.2), illumination light as illustrated at (1a) or (1b) in a block 230 in FIG. 20 is supplied to the Levenson type phase shift reticle. For large a partial coherent illumination to be provided in relation to the standard exposure, illumination light illustrated at (2a) in the block 230 is supplied to a desired reticle. Changing the partial coherent illumination from large σ to small σ may be done by replacing an aperture stop for large σ, usually disposed just after a fly's eye lens of the optical system 222, by an aperture stop for small σ having an aperture diameter sufficiently smaller than that of the former.

Here, the term "partial coherent illumination" refers to illumination wherein σ (="numerical aperture of an illumination optical system" divided by "numerical aperture of a projection optical system") is larger than zero and smaller than 1.

In the partial coherent illumination for periodic pattern exposure, σ is set to be not greater than 0.3. For the partial coherent illumination in the standard exposure, σ should desirably be set to be not lower than 0.6, preferably, σ=0.8. A better result is obtainable if the standard exposure is made by use of ring-like zone illumination where the illuminance distribution, of the illumination light just after the fly's eye lens, is lower at the inside area than at the outside area.

Any one of the masks as well as the exposure methods and exposure apparatuses as described hereinbefore, can be used for the manufacture of various devices such as semiconductor chips (e.g., ICs or LSIs), display devises (e.g. liquid crystal panels), detector elements (e.g., magnetic heads) or image pickup devices (e.g., CCDs).

Next, an embodiment of a semiconductor device manufacturing method which uses a projection exposure apparatus such as described above, will be explained.

Figure 21:
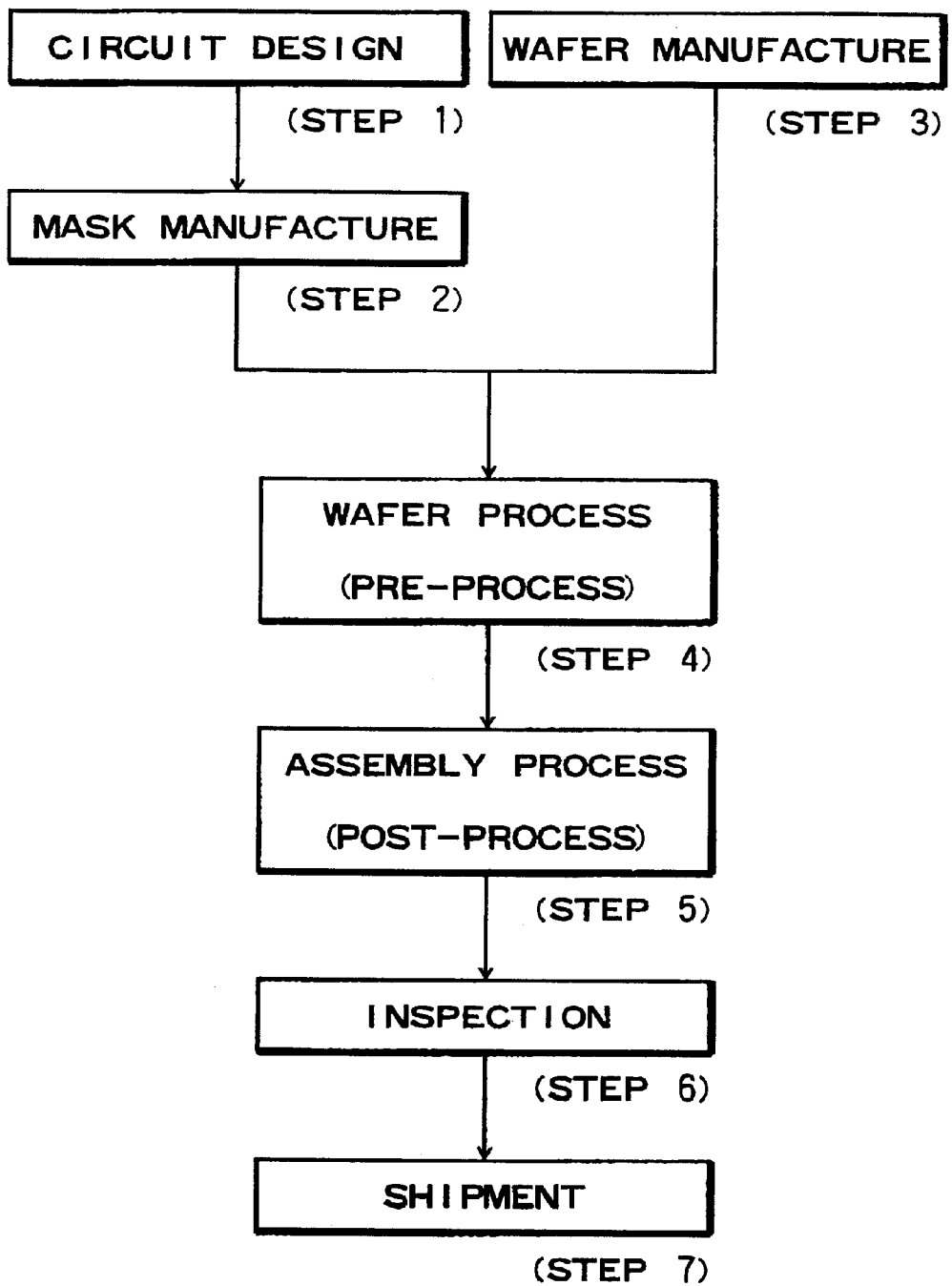
FIG. 21 is a flow chart of device manufacturing processes, in the present invention.

FIG. 21 is a flow chart of a procedure for the manufacture of microdevices such as semiconductor chips (e.g., ICs or LSIs), liquid crystal panels, or CCDs, for example.

Step 1 is a design process for designing a circuit of a semiconductor device Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 22:
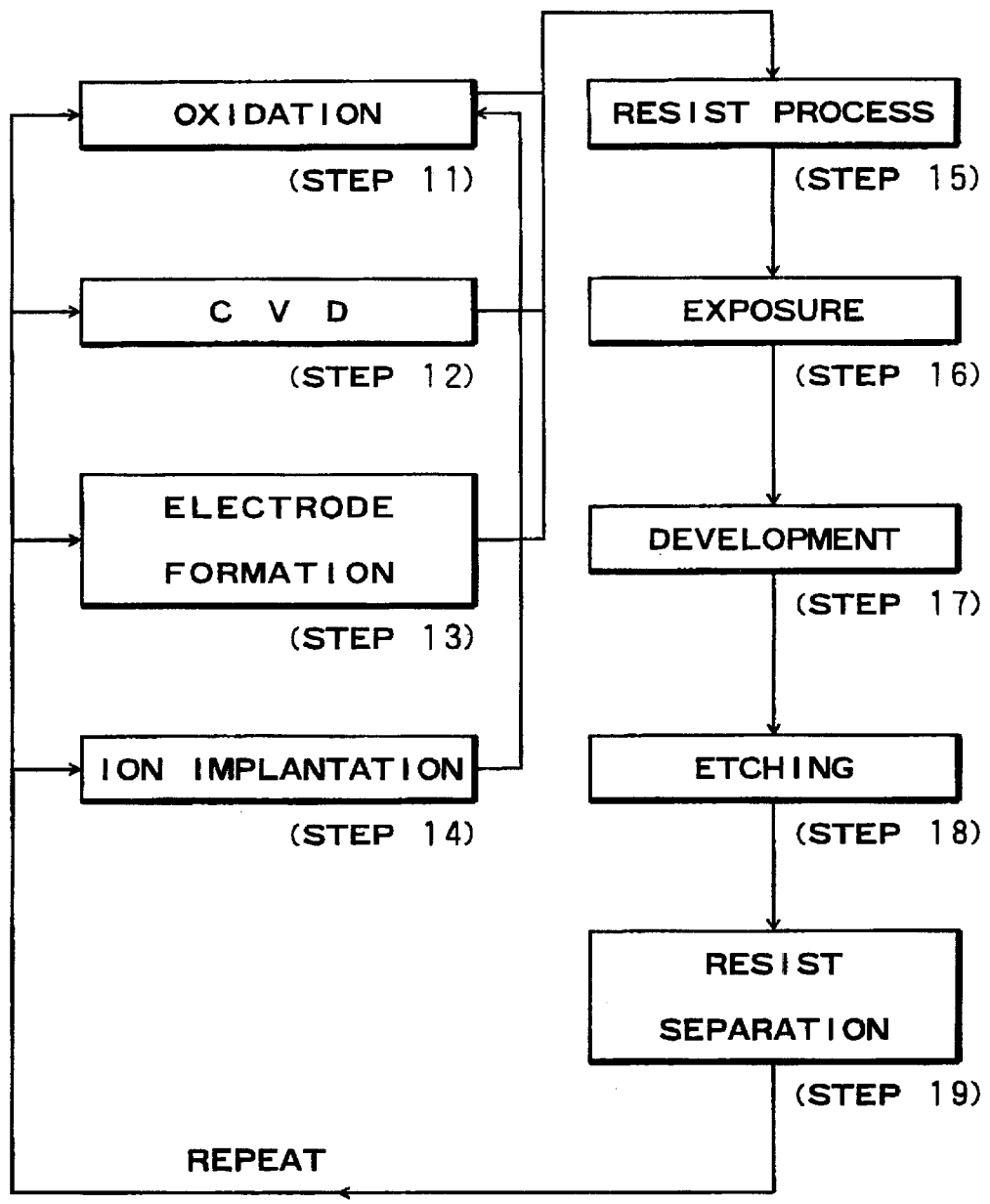
FIG. 22 is a flow chart of a wafer process in the procedure of FIG. 21.
Figure 23:
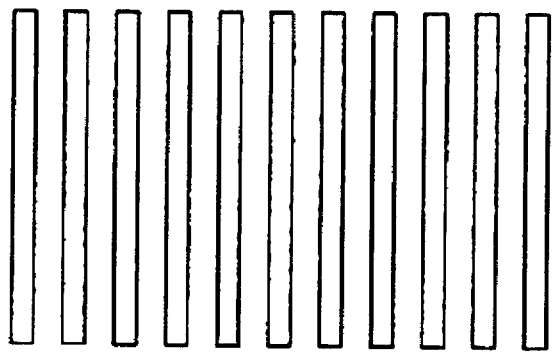
FIG. 23 is a schematic view for explaining pattern formation in a conventional dual exposure process.
Figure 23:
Figure 23:
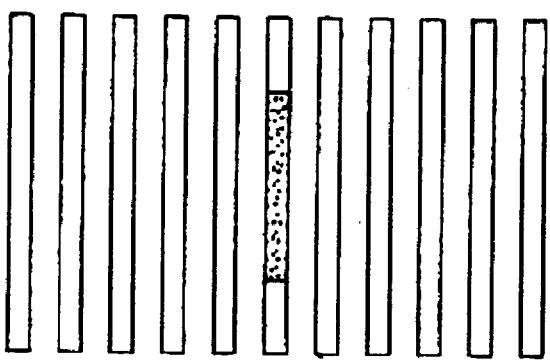
Figure 24:
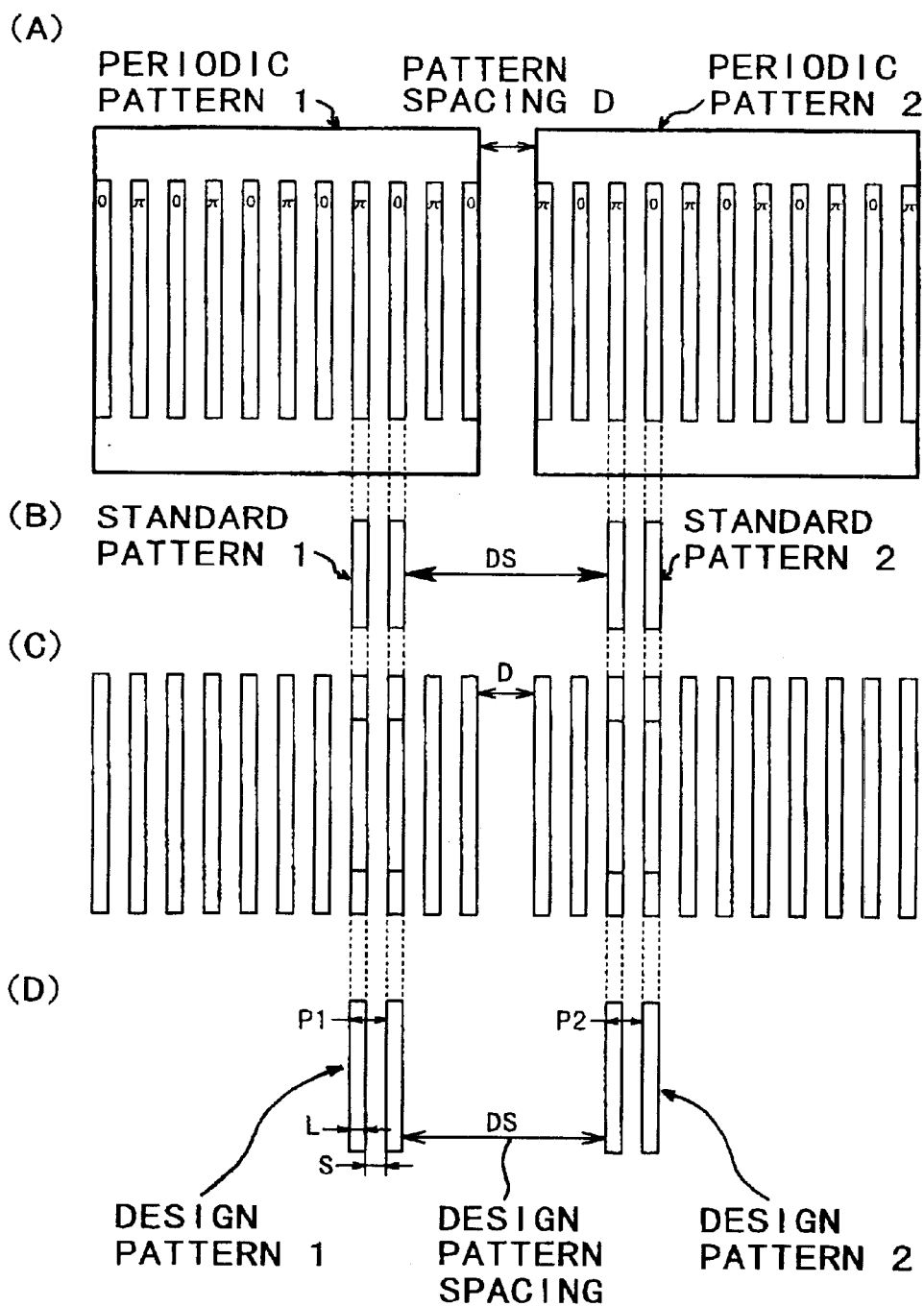
FIG. 24 is a schematic view for explaining periodic patterns and images thereof, in a conventional exposure process.

FIG. 22 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A mask for multiple exposure comprising:
a plurality of periodic patterns in which a relation $0.5S<D<1.5S$ is satisfied, where S is the spacing between lines of a first periodic pattern of said plurality of periodic patterns and D is the spacing between the first periodic pattern and a second periodic pattern, of said plurality of periodic patterns, juxtaposed to the first periodic pattern with respect to the periodicity direction, wherein the first periodic pattern and the second periodic pattern are free from overlapping or intersecting with each other.

2. A mask for multiple exposure comprising:
a plurality of periodic patterns in which a relation $0.9S<D<1.1S$ is satisfied, where S is the spacing between lines of a first periodic pattern of said plurality of periodic patterns and D is the spacing between the first periodic pattern and a second periodic pattern, of said plurality of periodic patterns, juxtaposed to the first periodic pattern with respect to the periodicity direction, wherein the first periodic pattern and the second periodic pattern are free from overlapping or intersecting with each other.

3. A mask according to claim 1, wherein adjoining portions of the first and second periodic patterns juxtaposed with each other have opposite pattern phases and each of the first and second periodic patterns includes two different types of light transmitting portions which are arranged so that (i) light passed through them have phases being mutually different by $\pi$, and (ii) the two types of light transmitting portions are arrayed alternately.

4. A mask, comprising:
a plurality of periodic patterns, wherein adjoining portions of first and second periodic patterns of said plurality of periodic patterns, juxtaposed with each other, have opposite pattern phases, wherein the first periodic pattern and the second periodic pattern are free from overlapping or intersecting with each other, and each of the first and second periodic patterns includes two different types of light transmitting portions which are arranged so that (i) light passed through them have phases being mutually different by $\pi$, (ii) the two types of light transmitting portions are arrayed alternately, and (iii) the first and second periodic patterns are juxtaposed with each other in a direction along the direction of periodicity of the pattern.

5. An exposure method comprising:
a process for exposing a photosensitive substrate to a mask as recited in any one of claims 1–4.

6. A multiple exposure method, comprising:
a first exposure process using a mask as recited in any one of claims 1–4; and
a second exposure process using another mask.

7. A device manufacturing method, comprising:
an exposure process for exposing a wafer to a device pattern by use of an exposure method as recited in claim 5; and
a developing process for developing the exposed wafer.

8. A mask, comprising:
first and second periodic patterns, wherein each of the first and second periodic patterns has a unit pitch defined by a line and a space,
wherein the first periodic pattern has a first pitch $P_1$ with a line width $L_1$ and a space width $S_1$ while the second periodic pattern has a second pitch $P_2$ with a line width $L_2$ and a space width $S_2$, the first and second pitches $P_1$ and $P_2$ are different from each other, the first and second periodic patterns are juxtaposed with each other with respect to the periodicity direction, with a spacing D, and, when one of the line widths $L_1$ and $L_2$ of the first and second periodic patterns is taken as L while one of the space widths $S_1$ and $S_2$ of the first and second periodic patterns is taken as S, a relation $0.5L \leq D \leq 1S + 0.5L$ is satisfied when $L<S$ is satisfied, whereas a relation $0.5S \leq D \leq 1L+0.5S$ is satisfied when $S \leq L$ is satisfied, wherein the first periodic pattern and the second periodic pattern are free from overlapping or intersecting with each other.

9. A mask, comprising:
first and second periodic patterns,
wherein each of the first and second periodic patterns has a unit pitch defined by a line and a space, the first periodic pattern has a first pitch $P_1$ with a line width $L_1$ and a space width $S_1$ while the second periodic pattern has a second pitch $P_2$ with a line width $L_2$ and a space width $S_2$, the first and second pitches $P_1$ and $P_2$ are different from each other, the first and second periodic patterns are juxtaposed with each other with respect to the periodicity direction, with a spacing D, and the spacing D is equal to at least one of the space width $S_1$ and the space width $S_2$, wherein the first periodic pattern and the second periodic pattern are free from overlapping or intersecting with each other.

10. A mask, comprising:
a plurality of periodic patterns each having a unit pitch defined by a line and a space,
wherein the plurality of periodic patterns include two periodic patterns having the same pitch and line width and being juxtaposed with each other with respect to the periodicity direction with a spacing D, and, when the line width is L and the space width is S and when the spacing D is not equal to S, the spacing D is in a range which satisfies a relation $0.5L \leq D<S$ or a relation $S<D \leq 1S+0.5L$ when $L<S$ is satisfied, whereas the spacing D is in a range which satisfies a relation $0.5S \leq D < L$ or a relation $1S < D \leq L+0.5S$ when $S \leq L$ is satisfied, wherein the first periodic pattern and the second periodic pattern are free from overlapping or intersecting with each other.

11. An exposure method, comprising:

a process for exposing a photosensitive substrate to a mask as recited in any one of claims 8–10.

12. A multiple exposure method, comprising:

a first exposure process using a mask as recited in any one of claims 8–10; and a second exposure process using another mask.

13. A device manufacturing method, comprising:

an exposure process for exposing a wafer to a device pattern by use of an exposure method as recited in claim 11; and a developing process for developing the exposed wafer.

14. A mask according to claim 2, wherein adjoining portions of the first and second periodic patterns juxtaposed with each other have opposite pattern phases and each of the first and second periodic patterns includes two different types of light transmitting portions which are arranged so that (i) light passed through them have phases being mutually different by $\pi$, and (ii) the two types of light transmitting portions are arrayed alternately.

15. A device manufacturing method, comprising:

an exposure process for exposing a wafer to a device pattern by use of an exposure method as recited in claim 6; and a developing process for developing the exposed wafer.

16. A device manufacturing method, comprising:

an exposure process for exposing a wafer to a device pattern by use of an exposure method as recited in claim 12; and a developing process for developing the exposed wafer.

* * * * *

UNITED STATES PATENT AND TRADEMARK OFFICE
CERTIFICATE OF CORRECTION

PATENT NO. : 6,620,556 B2 Page 1 of 1
DATED : September 16, 2003
INVENTOR(S) : Yumiko Ohsaki It is certified that error appears in the above-identified patent and that said Letters Patent is hereby corrected as shown below:

Column 6,
Line 7, "(multiple) exposure" should read -- (multiple exposure) --.

Column 11,
Line 8, "influence" should read -- influenced --.
Line 12, insert a new paragraph as follows:
-- (A) The region to be influenced is not used: --.
Line 28, "mast" should read -- mask --.

Column 12,
Line 65, "he" should read -- be --.

Column 18,
Line 20, "a" should read -- $\sigma$ --.
Line 55, "device Step" should read -- device. Step --.

Signed and Sealed this

Thirtieth Day of March, 2004

JON W. DUDAS
*Acting Director of the United States Patent and Trademark Office*